US012765154B2

(12) United States Patent
Yao et al.

(10) Patent No.: US 12,765,154 B2
(45) Date of Patent: Oct. 13, 2026

(54) MULTILAYER COMPOSITE TRANSPORT LAYER, PEROVSKITE SOLAR MODULE, AND PREPARATION METHOD THEREOF

(71) Applicant: HANGZHOU MICROQUANTA SEMICONDUCTOR CORPORATION LIMITED, Hangzhou (CN)

(72) Inventors: Jizhong Yao, Hangzhou (CN); Buyi Yan, Hangzhou (CN); Qicheng Hou, Hangzhou (CN); Lu Zhang, Hangzhou (CN)

(73) Assignee: HANGZHOU MICROQUANTA SEMICONDUCTOR CORPORATION LIMITED, Hangzhou (CN)

( * ) Notice: Subject to any disclaimer, the term of this patent is extended or adjusted under 35 U.S.C. 154(b) by 0 days.

(21) Appl. No.: 19/342,583

(22) Filed: Sep. 28, 2025

(65) Prior Publication Data

US 2026/0026180 A1 Jan. 22, 2026

Related U.S. Application Data

(63) Continuation of application No. PCT/CN2023/109240, filed on Jul. 26, 2023.

(30) Foreign Application Priority Data

Jun. 30, 2023 (CN) ......................... 202310798425.0

(51) Int. Cl.
*H10K 30/40* (2023.01)
*H10K 30/50* (2023.01)

(52) U.S. Cl.
CPC ............ *H10K 30/40* (2023.02); *H10K 30/50* (2023.02)

(58) Field of Classification Search
CPC ............................... H10K 30/40; H10K 30/50
See application file for complete search history.

(56) References Cited

U.S. PATENT DOCUMENTS

2011/0146768 A1* 6/2011 Lu ......................... H10F 77/244
136/255
2020/0251674 A1* 8/2020 Hayakawa ............. H10K 85/50

FOREIGN PATENT DOCUMENTS

CN 105405973 A 3/2016
CN 114388557 A 4/2022
(Continued)

OTHER PUBLICATIONS

Asare et al., "A Hybrid Hole Transport Layer for Perovskite-Based Solar Cells", Energies 2021, 14, 1949.*
(Continued)

*Primary Examiner* — Golam Mowla
(74) *Attorney, Agent, or Firm* — PORUS IP LLC

(57) ABSTRACT

The present disclosure relates to a multilayer composite transport layer, including a blocking graded layer, a graded layer, a hole transport layer, and a buffer layer stacked in sequence along a light incidence direction. A preparation material of the blocking graded layer is fluorine-doped tin oxide doped with element R to replace element F, with a replacement ratio of the element R to the element F ranging from 1% to 100%. The element R is at least one element of W, Nb, Ni, Al, or Si. A preparation material of the graded layer is $Ni_xA_ySi_zSn_mO_n$ or $Cu_xA_ySi_zSn_mO_n$, where x>0, y>=0, z>=0, m>=0, n>0, and A is aluminum (Al) or boron (B). A preparation material of the hole transport layer is $NiO_x$, $Cu_xO$, or CuSCN. A preparation material of the buffer layer is $Ni_aE_bN_cO_d$ or $Cu_aE_bN_cO_d$, where a>0, b>=0, c>0, d>=0, and E is Al, B, Si, Zn, Co, or Zr.

15 Claims, 10 Drawing Sheets

(56) References Cited

FOREIGN PATENT DOCUMENTS

| | | | | | |
|---|---|---|---|---|---|
| CN | 113782684 | B | * 10/2022 | ............. | B82Y 30/00 |
| CN | 115835654 | A | 3/2023 | | |
| CN | 218735822 | U | 3/2023 | | |

OTHER PUBLICATIONS

Ibn-Mohammed et al., "Perovskite solar cells: An integrated hybrid lifecycle assessment and review in comparison with other photovoltaic technologies", Renewable and Sustainable Energy Reviews 80 (2017) 1321-1344.*

Anrango-Camacho et al., "Recent Advances in Hole-Transporting Layers for Organic Solar Cells", Nanomaterials 2022, 12, 443.*

CN 218735822 U English translaiton provided by FIT database, translated on May 12, 2026.*

International Search Report in PCT/CN2023/109240 mailed on Mar. 11, 2024, 6 pages.

Written Opinion in PCT/CN2023/109240 mailed on Mar. 11, 2024, 5 pages.

The Extended European Search Report in European Application No. 23943106.7 mailed on Jun. 22, 2026, 5 pages.

* cited by examiner

MULTILAYER COMPOSITE TRANSPORT LAYER, PEROVSKITE SOLAR MODULE, AND PREPARATION METHOD THEREOF

CROSS-REFERENCE TO RELATED APPLICATIONS

This application is a continuation of International Application No. PCT/CN2023/109240, filed on Jul. 26, 2023, which claims priority of Chinese Application No. 202310798425.0, filed on Jun. 30, 2023, the entire contents of each of which are hereby incorporated by reference.

TECHNICAL FIELD

The present disclosure relates to the technical field of perovskite solar module preparation, and particularly to a multilayer composite transport layer, a perovskite solar module, and a preparation method thereof.

BACKGROUND

Perovskite solar modules typically adopt either a regular structure or an inverted structure. The regular structure includes, in order from a light-incident side: a transparent conductive layer, an electron transport layer, a perovskite active layer, a hole transport layer, and a back electrode. The inverted structure includes, in order from a light-incident side: a transparent conductive layer, a hole transport layer, a perovskite active layer, an electron transport layer, and a back electrode. In reported studies, the highest conversion efficiency of the perovskite solar modules with the inverted structure is slightly lower than that of the perovskite solar modules with the regular structure, but the overall stability of the perovskite solar modules with the inverted structure is superior. It is generally believed that the lower conversion efficiency of the perovskite solar modules with the inverted structure is mainly due to: energy band mismatch at the first interface formed between the transparent conductive layer and the hole transport layer, and high density of interface defects at the second interface formed between the hole transport layer and the perovskite active layer.

Materials for the hole transport layer generally are divided into three categories: 1) inorganic oxides or inorganic salts (e.g., $NiO_x$, $V_2O_5$, CuO, CuSCN, etc.); 2) organic polymers (e.g., P3HT, PTAA, etc.); 3) organic small molecules (e.g., spiro-OMeTAD and $PAC_z$-type self-assembled materials). Materials in category 1) are easily accessible and low-cost, but their good hole transport performance comes from inherent defects in the material—often requiring a high defect density to achieve better hole transport performance. However, a high defect density also worsens the photothermal stability of the second interface between the hole transport layer and the perovskite active layer, making it difficult to balance high conversion efficiency with good stability. Taking NiO as an example, to improve its hole mobility, the concentration of uncoordinated $Ni^{3+}$ needs to be increased, but a high concentration of $Ni^{3+}$ simultaneously serves as the technical origin triggering photocatalytic reactions between $NiO_x$ and the interface of the perovskite. Materials in category 2) generally require longer synthesis pathways, exhibit good hole transport performance, and are more likely to achieve high conversion efficiency inverted devices. The biggest drawback of the materials in category 2) is the poor photostability of the polymer material itself, which tends to decompose under long-term outdoor light exposure, leading to rapid performance degradation of the inverted device. Materials in category 3) can further improve the conversion efficiency of inverted devices compared to the materials in category 2), but similar to category 2), the stability of the materials in category 3) under long-term light exposure is poor due to the use of organic materials. Current approaches to address these limitations include using a composite structure of an inorganic hole transport layer and an organic hole transport layer or passivating inorganic hole transport layer. However, the composite structure of the inorganic hole transport layer and the organic hole transport layer is a superficial solution because the organic hole transport layer will still decompose under long-term light exposure, rendering the composite structure ineffective. Passivating the inorganic hole transport layer often sacrifices conversion efficiency for improved stability, which is also a temporary measure.

Additionally, common materials of the transparent conductive layer such as fluorine-doped tin oxide (FTO) often include a high concentration of fluorine (F) doping. These F elements carry the risk of migrating into the perovskite material during long-term use, leading to the degradation of the perovskite material. This compromises the stability of perovskite solar modules and reduces the service life of the perovskite solar modules.

Furthermore, the current preparation materials used for the hole transport layer are typically inorganic oxides. The hole transport layer of the inorganic oxides presents several issues: the structure formed by the inorganic oxides may be overly dense, causing problems in hole conduction; inorganic nanocrystals are prone to agglomeration due to surface defect-induced charge imbalance during long-term use, which affects material stability once agglomeration occurs; and the inorganic interface has numerous disordered dangling bonds, some of which may react with the perovskite materials.

Therefore, it is desired to provide a multilayer composite transport layer, a perovskite solar module, and a preparation method thereof, ensuring that the resultant perovskite solar module achieves both high conversion efficiency and excellent stability.

SUMMARY

One or more embodiments of the present disclosure provide a first multilayer composite transport layer, including a blocking graded layer, a graded layer, a hole transport layer, and a buffer layer stacked in sequence along a light incidence direction. A preparation material of the blocking graded layer is a fluorine-doped tin oxide material doped with element R to replace element F, with a replacement ratio of the element R to the element F ranging from 1% to 100%. The element R is at least one element of W, Nb, Ni, Al, or Si. A preparation material of the graded layer is $Ni_xA_ySi_zSn_mO_n$ or $Cu_xA_ySi_zSn_mO_n$, where x>0, y>=0, z>=0, m>=0, n>0, and A is aluminum (Al) or boron (B). A preparation material of the graded layer includes at least one element of A, Si, or Sn. A preparation material of the hole transport layer is one of $NiO_x$, $Cu_2O$, or CuSCN. A preparation material of the buffer layer is $Ni_aE_bN_cO_d$ or $Cu_aE_bN_cO_d$, where a>0, b>=0, c>0, d>=0, and E is one element of Al, B, Si, Zn, Co, or Zr.

One or more embodiments of the present disclosure provide a second multilayer composite transport layer, including a blocking graded layer, a graded layer, a hole transport layer, and a buffer layer stacked in sequence along a light incidence direction. A preparation material of the blocking graded layer is a fluorine-doped tin oxide material doped with element R to replace element F, with a replacement ratio of the element R to the element F ranging from 1% to 100%. The element R is at least one element of W, Nb, Ni, Al, or Si. A preparation material of the graded layer is $Ni_xA_ySi_zSn_mO_n$ or $Cu_xA_ySi_zSn_mO_n$, where x>0, y≥0, z≥0, m>0, n>0, and A is aluminum or boron. A preparation material of the graded layer includes at least one element of A, Si, or Sn. A preparation material of the hole transport layer is one of $NiO_x$, $Cu_2O$, or CuSCN. A preparation material of the buffer layer is $Ni_aE_bN_cO_d$ or $Cu_aE_bN_cO_d$, where a>0, b>0, c>0, d>0, and E is one element of Al, B, Si, Zn, Co, or Zr. The preparation material of at least one of the blocking graded layer, the graded layer, or the buffer layer is doped with a coupling agent to obtain at least one of an array blocking graded layer, an array graded layer, or an array buffer layer including the coupling agent. A thin film of at least one of the blocking graded layer, the graded layer, or the buffer layer doped with the coupling agent includes a plurality of array molecular clusters including the coupling agent which are discretely arranged and openings separating adjacent molecular clusters. The openings connect an upper surface and a lower surface of the thin film. The coupling agent is one of a silane coupling agent, a titanate coupling agent, an aluminate coupling agent, a phosphate coupling agent, or a borate coupling agent. A length of each of the openings is in a range of 10 nm~200 nm.

One or more embodiments of the present disclosure also provide a first perovskite solar module. An internal structure of the first perovskite solar module includes a transparent conductive layer, a perovskite light-absorbing layer, an electron transport layer, and a back electrode stacked in sequence. The aforementioned first multilayer composite transport layer is arranged between the transparent conductive layer and the perovskite light-absorbing layer. The blocking graded layer of the first multilayer composite transport layer is in laminated contact with the transparent conductive layer, and the buffer layer is in laminated contact with the perovskite light-absorbing layer.

One or more embodiments of the present disclosure also provide a second perovskite solar module. An internal structure of the second perovskite solar module includes a transparent conductive layer, a perovskite light-absorbing layer, an electron transport layer, and a back electrode stacked in sequence. The aforementioned second multilayer composite transport layer is arranged between the transparent conductive layer and the perovskite light-absorbing layer. The blocking graded layer of the second multilayer composite transport layer is in laminated contact with the transparent conductive layer, and the buffer layer is in laminated contact with the perovskite light-absorbing layer.

One or more embodiments of the present disclosure also provide a method for preparing the aforementioned first perovskite solar module, including:

Step 1: cleaning and performing ultraviolet (UV)-ozone treatment on the transparent conductive layer.

Step 2: preparing the blocking graded layer on the transparent conductive layer by a vapor-phase deposition or a liquid-phase deposition. The vapor-phase deposition includes using one of an atomic layer deposition (ALD) device, a chemical vapor deposition (CVD) device, a magnetron sputtering device, an electron beam evaporation device, or a thermal evaporation device to prepare the blocking graded layer. The liquid-phase deposition includes one of a mixed solution method, a hydrothermal method, a chemical bath deposition method, or an in-situ doping method.

Step 3: preparing the graded layer on the blocking graded layer by the vapor-phase deposition or the liquid-phase deposition. The vapor-phase deposition includes using one of the ALD device, the CVD device, the magnetron sputtering device, the electron beam evaporation device, or the thermal evaporation device to prepare the graded layer. The liquid-phase deposition includes one of the mixed solution method, the hydrothermal method, the chemical bath deposition method, or the in-situ doping method.

Step 4: preparing the hole transport layer on a surface of the graded layer using one of the ALD device, the CVD device, the magnetron sputtering device, the electron beam evaporation device, or the thermal evaporation device, or preparing the hole transport layer by a process of a solution blade coating, a slot-die coating, or a spray coating.

Step 5: preparing the buffer layer on a surface of the hole transport layer using the vapor-phase deposition or the liquid-phase deposition. The vapor-phase deposition includes using one of the ALD device, the CVD device, the magnetron sputtering device, the electron beam evaporation device, or the thermal evaporation device to prepare the buffer layer, the liquid-phase deposition includes one of the mixed solution method, the hydrothermal method, the chemical bath deposition method, or the in-situ doping method.

Step 6: sequentially preparing the perovskite light-absorbing layer, the electron transport layer, and the back electrode on a surface of the buffer layer until a fabrication of the first perovskite solar module is completed.

One or more embodiments of the present disclosure also provide a method for preparing the aforementioned second perovskite solar module, including:

Step I: cleaning and performing UV-ozone treatment on the transparent conductive layer.

Step II: preparing the blocking graded layer on the transparent conductive layer by a vapor-phase deposition or a liquid-phase deposition. The vapor-phase deposition includes using an ALD device, a CVD device, a magnetron sputtering device, an electron beam evaporation device, or a thermal evaporation device to prepare the blocking graded layer. The liquid-phase deposition includes one of a mixed solution method, a hydrothermal method, a chemical bath deposition method, or an in-situ doping method.

Step III: mixing the coupling agent with a material solution for preparing the graded layer to obtain a first composite precursor solution, performing UV light treatment or high-temperature treatment on the first composite precursor solution to obtain a treated first composite precursor solution, coat the treated first composite precursor solution onto a surface of the blocking graded layer, and anneal and dry to obtain the array graded layer.

Step IV: preparing the hole transport layer on a surface of the array graded layer using one of the ALD device, the CVD device, the magnetron sputtering device, the electron beam evaporation device, or the thermal evaporation device, or preparing the hole transport layer by a process of a solution blade coating, a slot-die coating, or a spray coating.

Step V: preparing the buffer layer on a surface of the hole transport layer using the vapor-phase deposition or the liquid-phase deposition. The vapor-phase deposition includes using one of the ALD device, the CVD device, the magnetron sputtering device, the electron beam evaporation device, or the thermal evaporation device to prepare the buffer layer. The liquid-phase deposition includes one of the mixed solution method, the hydrothermal method, the chemical bath deposition method, or the in-situ doping method.

Step VI: sequentially preparing the perovskite light-absorbing layer, the electron transport layer, and the back electrode on a surface of the buffer layer until a fabrication of the second perovskite solar module is completed.

One or more embodiments of the present disclosure also provide a method for preparing the aforementioned second perovskite solar module, including:

Step 1: cleaning and performing UV-ozone treatment on the transparent conductive layer 6.

Step 2: preparing the blocking graded layer on the transparent conductive layer 6 by a vapor-phase deposition or a liquid-phase deposition. The vapor-phase deposition includes using an ALD device, a CVD device, a magnetron sputtering device, an electron beam evaporation device, or a thermal evaporation device to prepare the blocking graded layer. The liquid-phase deposition includes one of a mixed solution method, a hydrothermal method, a chemical bath deposition method, or an in-situ doping method.

Step 3: preparing the graded layer on the blocking graded layer by the vapor-phase deposition or the liquid-phase deposition. The vapor-phase deposition includes using one of the ALD device, the CVD device, the magnetron sputtering device, the electron beam evaporation device, or the thermal evaporation device to prepare the graded layer. The liquid-phase deposition includes one of the mixed solution method, the hydrothermal method, the chemical bath deposition method, or the in-situ doping method.

Step 4: preparing the hole transport layer on a surface of the graded layer using one of the ALD device, the CVD device, the magnetron sputtering device, the electron beam evaporation device, or the thermal evaporation device, or preparing the hole transport layer by a process of a solution blade coating, a slot-die coating, or a spray coating.

Step 5: mixing the coupling agent with a material solution for preparing the buffer layer to obtain a second composite precursor solution, performing UV light treatment or high-temperature treatment on the second composite precursor solution to obtain a treated second composite precursor solution, coating the treated second composite precursor solution onto a surface of the hole transport layer, and anneal and dry to obtain the array buffer layer.

Step 6: sequentially preparing the perovskite light-absorbing layer, the electron transport layer, and the back electrode on a surface of the array buffer layer until a fabrication of the second perovskite solar module is completed.

One or more embodiments of the present disclosure also provide a method for preparing the aforementioned second perovskite solar module, including:

Step A: cleaning and performing UV-ozone treatment on the transparent conductive layer 6.

Step B: mixing the coupling agent with a material solution for preparing the blocking graded layer to obtain a third composite precursor solution, performing UV light treatment or high-temperature treatment on the third composite precursor solution to to obtain a treated third composite precursor solution, coating the treated third composite precursor solution onto a surface of the transparent conductive layer, and annealing and drying to obtain the array blocking graded layer.

Step C: preparing the graded layer on the array blocking graded layer using a vapor-phase deposition or a liquid-phase deposition. The vapor-phase deposition includes using an ALD device, a CVD device, a magnetron sputtering device, an electron beam evaporation device, or a thermal evaporation device to prepare the graded layer. The liquid-phase deposition includes one of a mixed solution method, a hydrothermal method, a chemical bath deposition method, or an in-situ doping method.

Step D: preparing the hole transport layer on a surface of the graded layer using one of the ALD device, the CVD device, the magnetron sputtering device, the electron beam evaporation device, or the thermal evaporation device, or preparing the hole transport layer by a process of a solution blade coating, a slot-die coating, or a spray coating.

Step E: preparing the buffer layer on a surface of the hole transport layer using the vapor-phase deposition or the liquid-phase deposition. The vapor-phase deposition includes using one of the ALD device, the CVD device, the magnetron sputtering device, the electron beam evaporation device, or the thermal evaporation device to prepare the buffer layer. The liquid-phase deposition includes one of the mixed solution method, the hydrothermal method, the chemical bath deposition method, or the in-situ doping method.

Step F: sequentially preparing the perovskite light-absorbing layer, the electron transport layer, and the back electrode on a surface of the buffer layer until a fabrication of the second perovskite solar module is completed.

BRIEF DESCRIPTION OF THE DRAWINGS

The present disclosure will be further explained through exemplary embodiments, which are described in detail with accompanying drawings. These embodiments are non-limiting, and identical reference numbers denote identical structures.

DETAILED DESCRIPTION

In order to make the technical problems, solutions, and beneficial effects of the present disclosure clearer and more comprehensible, the following provides a further detailed description of the present disclosure in conjunction with the accompanying drawings and embodiments. It should be understood that the specific embodiments described herein are only intended to explain the present disclosure and not to limit the present disclosure.

Figure 1:
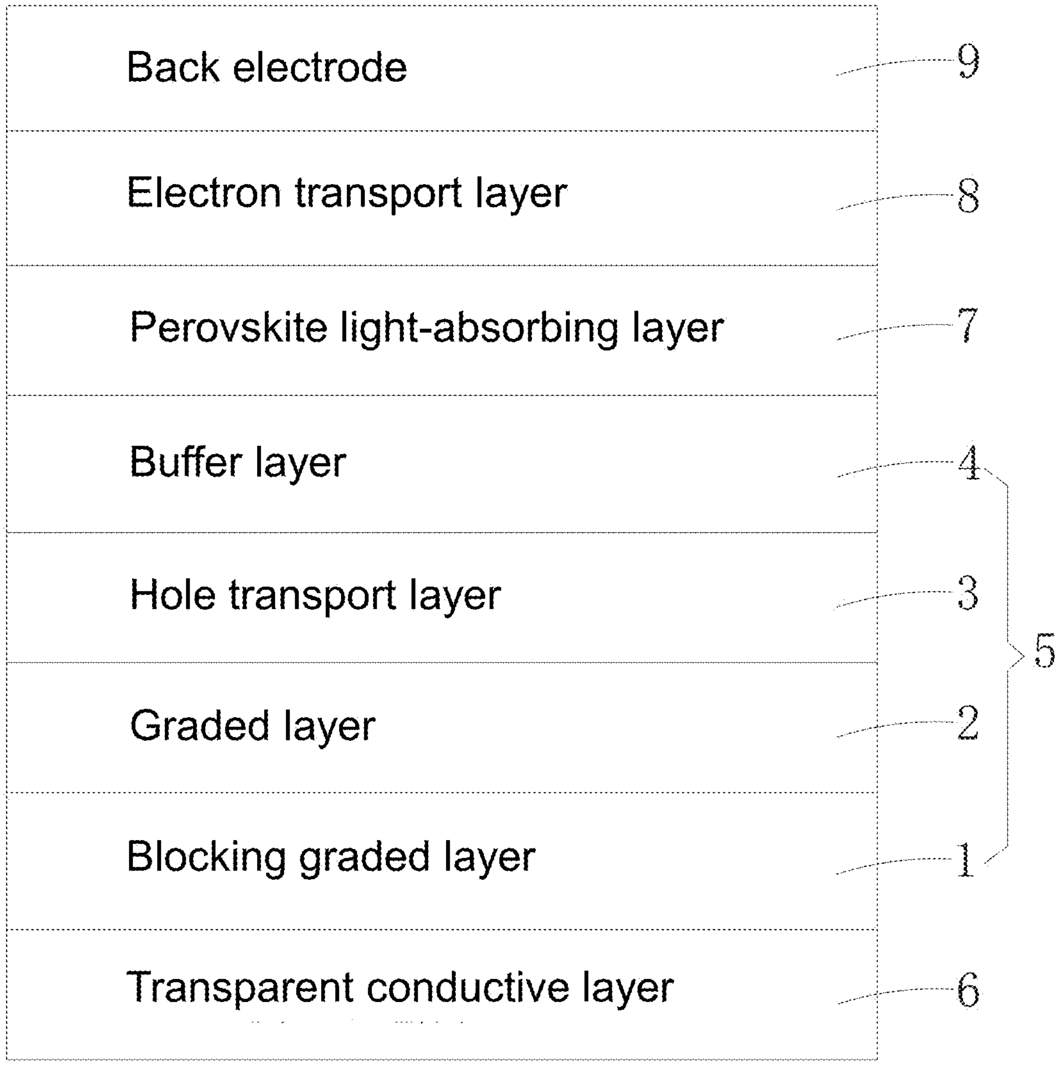
FIG. 1 is a schematic plan view of an internal structure of a first perovskite solar module according to some embodiments of the present disclosure.

FIG. 1 is a schematic plan view of an internal structure of a first perovskite solar module according to some embodiments of the present disclosure.

As shown in FIG. 1, a first multilayer composite transport layer is provided by some embodiments of the present disclosure. The first multilayer composite transport layer includes a blocking graded layer 1, a graded layer 2, a hole transport layer 3, and a buffer layer 4 stacked in sequence along a light incidence direction. A preparation material of the blocking graded layer 1 is a fluorine-doped tin oxide material doped with element R to replace element F, with a replacement ratio of the element R to the element F ranging from 1% to 100%. The element R is at least one element of W, Nb, Ni, Al, or Si. A preparation material of the graded layer 2 is $Ni_xA_ySi_zSn_mO_n$ or $Cu_xA_ySi_zSn_mO_n$, where x>0, y>=0, z>=0, m>=0, n>0, and A is aluminum (Al) or boron (B). A preparation material of the graded layer 2 includes at least one element of A, Si, or Sn. A preparation material of the hole transport layer 3 is one of $NiO_x$, $Cu_2O$, or CuSCN. A preparation material of the buffer layer 4 is $Ni_aE_bN_cO_d$ or $Cu_aE_bN_cO_d$, where a>0, b>=0, c>0, d>=0, and E is one element of Al, B, Si, Zn, Co, or Zr.

Stacked in sequence refers to an arrangement of a plurality of layers or structures in a specific order, one on top of another. As shown in FIG. 1, the buffer layer 4 is located above the hole transport layer 3, the hole transport layer 3 is located above the graded layer 2, and the graded layer 2 is located above the blocking graded layer 1.

The blocking graded layer 1 may be configured to prevent external environmental factors (such as oxygen and moisture) from affecting internal components of a device, thereby improving the stability and lifespan of the device. By doping with element R, the conductivity and charge injection properties of the material can be adjusted to optimize charge transport efficiency.

The graded layer 2 may be configured to facilitate charge transport from the blocking graded layer 1 to the hole transport layer 3, improving charge injection efficiency. By adjusting the composition and ratio of the material, the energy level structure of the graded layer 2 can be optimized to match the energy levels of the blocking graded layer 1 and the hole transport layer 3, reducing charge traps and improving the overall stability of the device while minimizing interface defects.

The hole transport layer 3 may be configured to efficiently inject holes, promote hole transport and recombination, and enhance the light emission efficiency of the device. Similarly, the material selection and preparation process of the hole transport layer 3 can optimize the energy level structure of the hole transport layer 3 to match the energy levels of the graded layer 2 and the buffer layer 4, reducing charge traps and improving the overall stability of the device while minimizing interface defects.

The buffer layer 4 may be configured to balance the injection of holes and electrons, optimizing the charge balance of the device and improving light emission efficiency. Similarly, the material selection and preparation process of the buffer layer 4 can optimize the energy level structure of the buffer layer 4 to match the energy levels of the hole transport layer 3 and a light-emitting layer, reducing charge traps and improving the overall stability of the device while minimizing interface defects.

Figure 2:
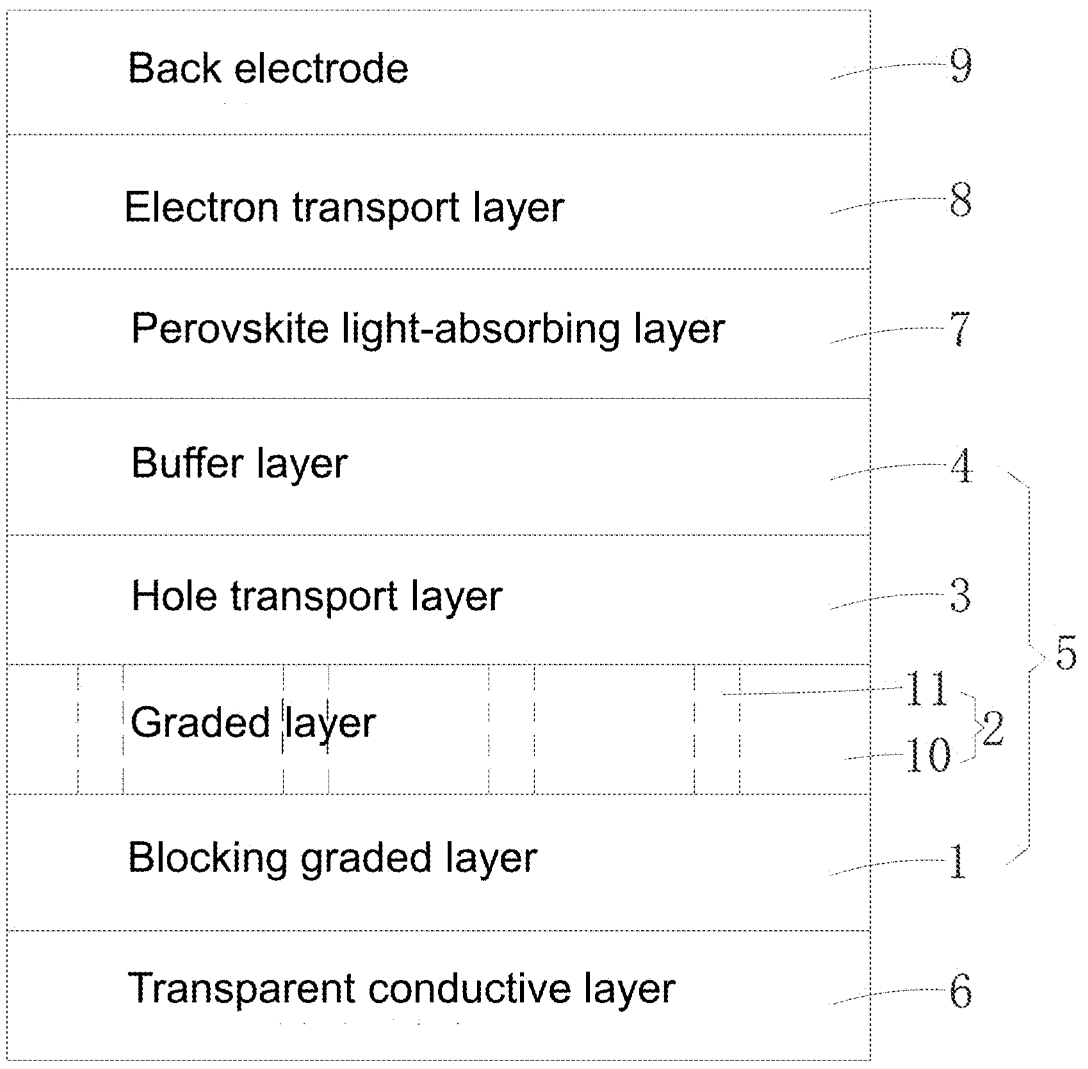
FIG. 2 is a schematic plan view of a first internal structure of a second perovskite solar module according to some embodiments of the present disclosure.
Figure 3:
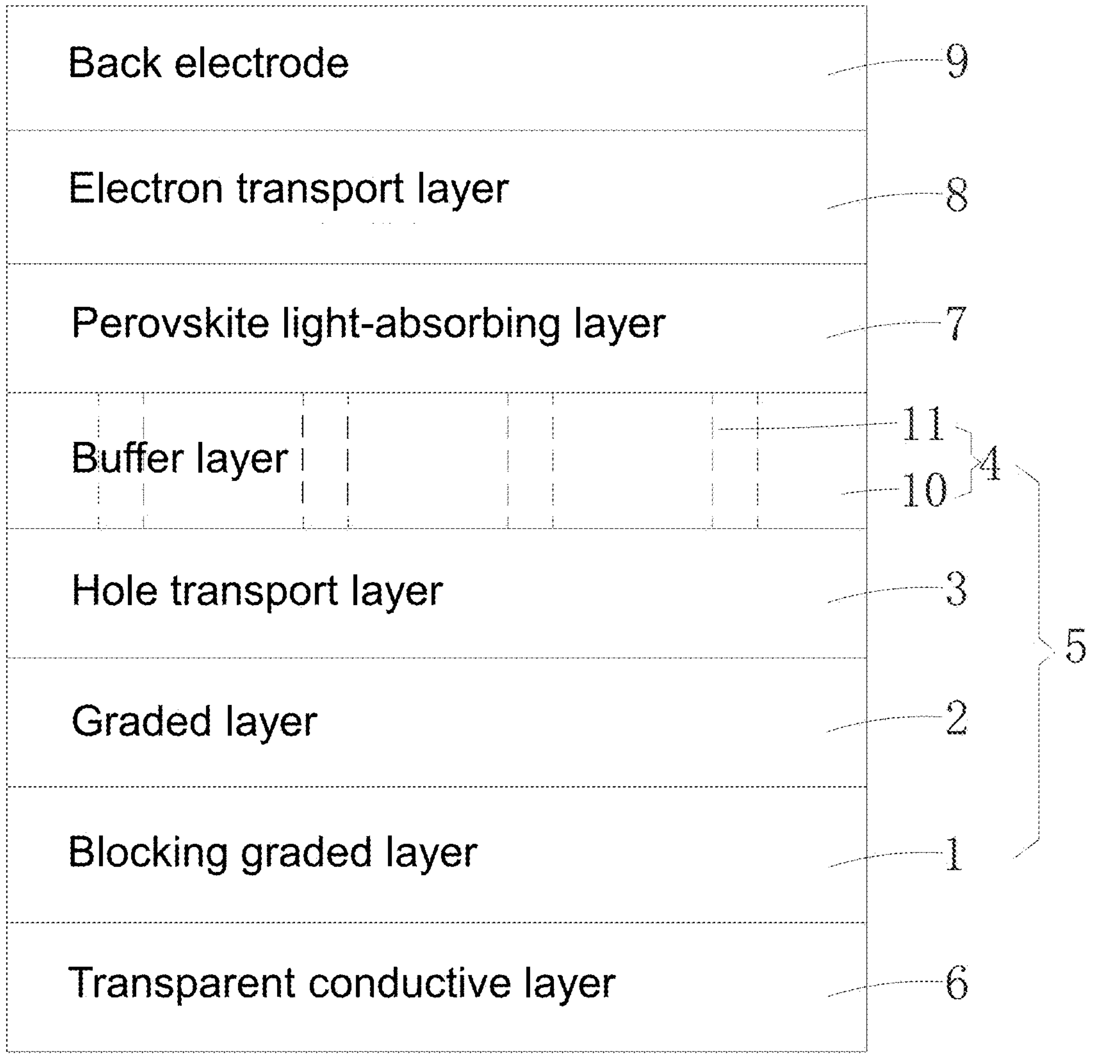
FIG. 3 is a schematic plan view of a second internal structure of the second perovskite solar module according to some embodiments of the present disclosure.
Figure 4:
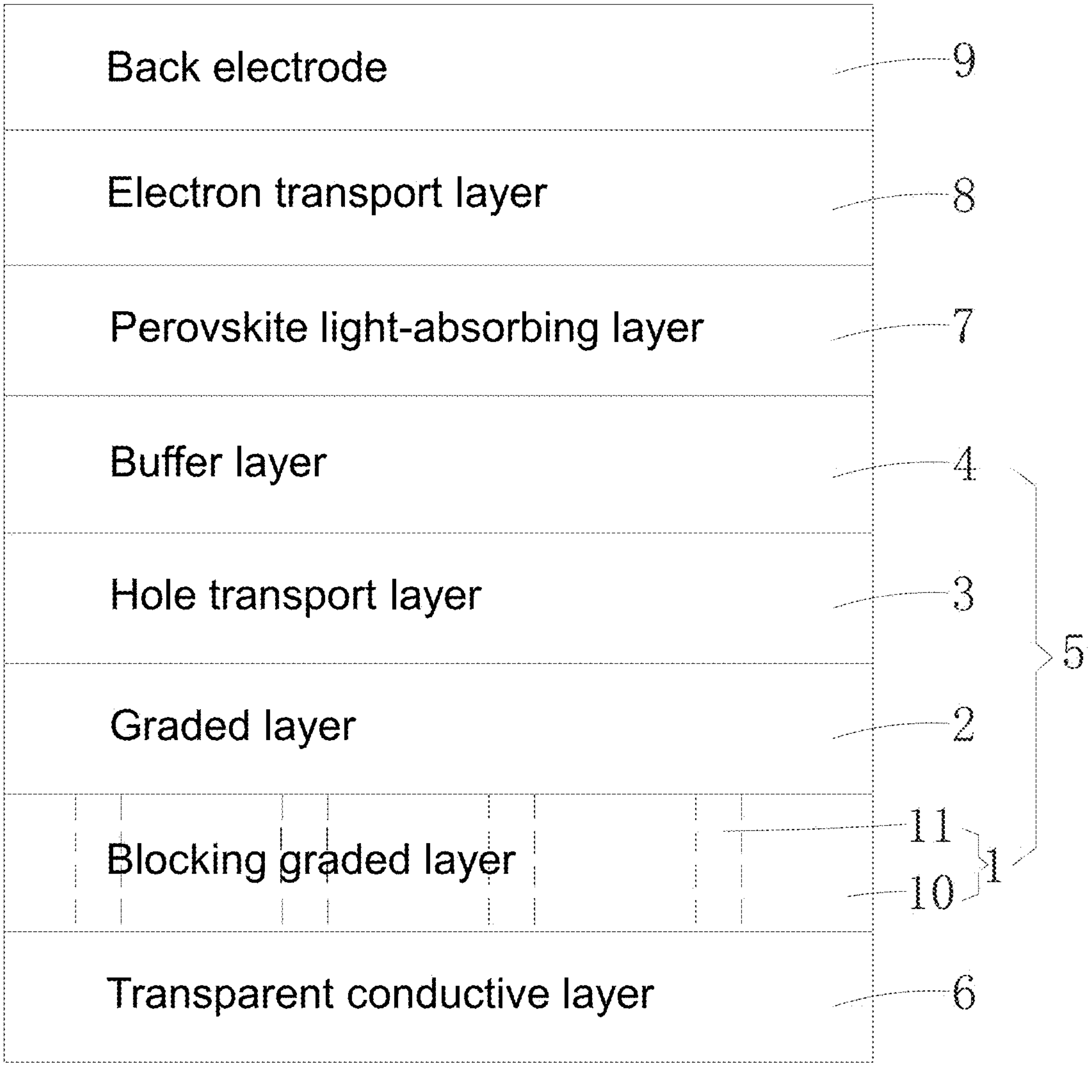
FIG. 4 is a schematic plan view of a third internal structure of the second perovskite solar module according to some embodiments of the present disclosure.

FIG. 2 is a schematic plan view of a first internal structure of a second perovskite solar module according to some embodiments of the present disclosure. FIG. 3 is a schematic plan view of a second internal structure of the second perovskite solar module according to some embodiments of the present disclosure. FIG. 4 is a schematic plan view of a third internal structure of the second perovskite solar module according to some embodiments of the present disclosure.

As shown in FIGS. 2-4, the second multilayer composite transport layer provided in some embodiments of the present disclosure includes a blocking graded layer 1, a graded layer 2, a hole transport layer 3, and a buffer layer 4 stacked in sequence along a light incidence direction. A preparation material of the blocking graded layer 1 is a fluorine-doped tin oxide material doped with element R to replace element F, with a replacement ratio of the element R to the element F ranging from 1% to 100%. The element R is at least one element of W, Nb, Ni, Al, or Si. A preparation material of the graded layer 2 is $Ni_xA_ySi_zSn_mO_n$ or $Cu_xA_ySi_zSn_mO_n$, where x>0, y≥0, z≥0, m>0, n>0, and A is aluminum or boron. A preparation material of the graded layer 2 includes at least one element of A, Si, or Sn. A preparation material of the hole transport layer 3 is one of $NiO_x$, $Cu_2O$, or CuSCN. A preparation material of the buffer layer 4 is $Ni_aE_bN_cO_d$ or $Cu_aE_bN_cO_d$, where a>0, b≥0, c>0, d>0, and E is one element of Al, B, Si, Zn, Co, or Zr.

The preparation material of at least one of the blocking graded layer 1, the graded layer 2, or the buffer layer 4 is doped with a coupling agent to obtain at least one of an array blocking graded layer, an array graded layer, or an array buffer layer including the coupling agent. A thin film of the blocking graded layer 1, the graded layer 2, and/or the buffer layer 4 doped with the coupling agent includes a plurality of discretely molecular clusters 11 including the coupling agent which are arranged array and openings 10 separating adjacent molecular clusters. The openings 10 connect an upper surface and a lower surface of the thin film. The coupling agent is one of a silane coupling agent, a titanate coupling agent, an aluminate coupling agent, a phosphate coupling agent, or a borate coupling agent.

The coupling agent may be configured to improve compatibility and adhesion between materials. The openings 10 connect the upper surface and the lower surface of the thin film, facilitating charge transport and uniform material distribution.

In some embodiments, an addition amount of the coupling agent is 0.5~5% of a volume of a nanoparticle suspension used to prepare the blocking graded layer 1, the graded layer 2, and/or the buffer layer 3, and a concentration of the nanoparticle suspension is in a range of 0.1~10 wt. %. In some embodiments, the addition amount of the coupling agent is 0.1~0.5% of the volume of the nanoparticle suspension used to prepare the blocking graded layer 1, the graded layer 2, and/or the buffer layer 3, and the concentration of the nanoparticle suspension is in a range of 0.05~0.1 wt. %. In some embodiments, the addition amount of the coupling agent is 5~6% of the volume of the nanoparticle suspension used to prepare the blocking graded layer 1, the graded layer 2, and/or the buffer layer 3, and the concentration of the nanoparticle suspension is in a range of 10~12 wt. %. In some embodiments, the addition amount of the coupling agent is 0.5~2.5% of the volume of the nanoparticle suspension used to prepare the blocking graded layer 1, the graded layer 2, and/or the buffer layer 3, and the concentration of the nanoparticle suspension is in a range of 0.1~5 wt. %. In some embodiments, the addition amount of the coupling agent is 2.5~5% of the volume of the nanoparticle suspension used to prepare the blocking graded layer 1, the graded layer 2, and/or the buffer layer 3, and the concentration of the nanoparticle suspension is in a range of 5~10 wt. %.

In some embodiments, a length of each of the openings 10 is in a range of 10 nm~200 nm. In some embodiments, the length of each of the openings 10 is in a range of 5 nm~10 nm. In some embodiments, the length of each of the openings 10 is in a range of 200 nm~250 nm. In some embodiments, the length of each of the openings 10 is in a range of 10 nm~100 nm. In some embodiments, the length of each of the openings 10 is in a range of 100 nm~200 nm.

In some embodiments, in the first multilayer composite transport layer and the second multilayer composite transport layer provided by some embodiments of the present disclosure, a thickness of the blocking graded layer 1 is in a range of 1 nm~30 nm, a thickness of the graded layer 2 is in a range of 0.2 nm~30 nm, a thickness of the hole transport layer 3 is in a range of 1 nm~100 nm, and a thickness of the buffer layer 4 is in a range of 0.2 nm~50 nm. In some embodiments, the thickness of the blocking graded layer 1 is in a range of 0.5 nm~1 nm, the thickness of the graded layer 2 is in a range of 0.1 nm~0.2 nm, the thickness of the hole transport layer 3 is in a range of 0.5 nm~1 nm, and the thickness of the buffer layer 4 is in a range of 0.1 nm~0.2 nm. In some embodiments, the thickness of the blocking graded layer 1 is in a range of 30 nm~40 nm, the thickness of the graded layer 2 is in a range of 30 nm~40 nm, the thickness of the hole transport layer 3 is in a range of 100 nm~120 nm, and the thickness of the buffer layer 4 is in a range of 50 nm~60 nm. In some embodiments, the thickness of the blocking graded layer 1 is in a range of 1 nm~15 nm, the thickness of the graded layer 2 is in a range of 0.2 nm~15 nm, the thickness of the hole transport layer 3 is in a range of 1 nm~50 nm, and the thickness of the buffer layer 4 is in a range of 0.2 nm~25 nm. In some embodiments, the thickness of the blocking graded layer 1 is in a range of 15 nm~30 nm, the thickness of the graded layer 2 is in a range of 15 nm~30 nm, the thickness of the hole transport layer 3 is in a range of 50 nm~100 nm, and the thickness of the buffer layer 4 is in a range of 25 nm~50 nm.

As shown in FIG. 1, some embodiments of the present disclosure also provide a first perovskite solar module. An internal structure of the first perovskite solar module includes a transparent conductive layer 6, a perovskite light-absorbing layer 7, an electron transport layer 8, and a back electrode 9 stacked in sequence. The aforementioned first multilayer composite transport layer 5 is arranged between the transparent conductive layer 6 and the perovskite light-absorbing layer 7. The blocking graded layer 1 of the first multilayer composite transport layer 5 is in laminated contact with the transparent conductive layer 6, and the buffer layer 4 is in laminated contact with the perovskite light-absorbing layer 7. The graded layer 2 and the hole transport layer 3 of the first multilayer composite transport layer 5 are located between the blocking graded layer 1 and the buffer layer 4, with the graded layer 2 in laminated contact with the blocking graded layer 1 and the hole transport layer 3 in laminated contact with the buffer layer 4.

Here, "laminated contact" refers to a tight contact between two objects or layers without obvious gaps or intervals. Methods to achieve laminated contact include, but are not limited to, physical deposition, spin coating, hot pressing, adhesive bonding, etc.

The transparent conductive layer 6 is an outermost transparent conductive material of the first perovskite solar module. In some embodiments, the transparent conductive layer 6 may be configured to collect and transport photogenerated carriers (electrons and holes).

The perovskite light-absorbing layer 7 is a core component of the first perovskite solar module. In some embodiments, the perovskite light-absorbing layer 7 may be configured to absorb photons and generate electron-hole pairs.

The electron transport layer 8 is located between the perovskite light-absorbing layer 7 and the back electrode 9 and may be configured to transport electrons generated in the perovskite light-absorbing layer 7 to the back electrode 9.

The back electrode 9 serves as a rear electrode of the first perovskite solar module and may be configured to collect and transport electrons to an external circuit. In some embodiments, the back electrode 9 may also provide physical support for the entire first perovskite solar module.

In some embodiments of the present disclosure, the first perovskite solar module employs a multilayer composite transport layer, retaining a high defect density and high hole mobility of the hole transport material. This enables the first perovskite solar module incorporating this multilayer composite transport layer to achieve both high conversion efficiency and excellent long-term photothermal stability.

As shown in FIGS. 2-4, some embodiments of the present disclosure also provide a second perovskite solar module. An internal structure of the second perovskite solar module includes a transparent conductive layer 6, a perovskite light-absorbing layer 7, an electron transport layer 8, and a back electrode 9 stacked in sequence. The aforementioned second multilayer composite transport layer 5 is arranged between the transparent conductive layer 6 and the perovskite light-absorbing layer 7. The blocking graded layer 1 of the second multilayer composite transport layer 5 is in laminated contact with the transparent conductive layer 6, and the buffer layer 4 is in laminated contact with the perovskite light-absorbing layer 7. The graded layer 2 and the hole transport layer 3 of the second multilayer composite transport layer 5 are located between the blocking graded layer 1 and the buffer layer 4, with the graded layer 2 in laminated contact with the blocking graded layer 1 and the hole transport layer 3 in laminated contact with the buffer layer 4. Descriptions of the blocking graded layer, the graded layer, the hole transport layer, the buffer layer, the transparent conductive layer, the perovskite light-absorbing layer, the electron transport layer, and the back electrode are the same as those for the first perovskite solar module and will not be repeated here.

In the first perovskite solar module and the second perovskite solar module provided by some embodiments of the present disclosure, a material used to prepare the perovskite light-absorbing layer 7 has a molecular formula $ABX_3$. Here, A represents at least one cation from cesium, rubidium, amine groups, amidine groups, or alkali metals; B represents any divalent metal cation from lead, tin, tungsten, copper, zinc, gallium, germanium, arsenic, selenium, rhodium, palladium, silver, cadmium, indium, antimony, osmium, iridium, platinum, gold, mercury, thallium, bismuth, or polonium; and X represents any anion from iodine, bromine, chlorine, astatine, thiocyanate, or acetate.

The second multilayer composite transport layer of the second perovskite solar module provided by some embodiments of the present disclosure has the following characteristics.

1. During coating, nanoparticles simply form openings, addressing the issue of overly dense inorganic oxide layer structures. This eliminates the impact of the thicknesses of the graded layer and the buffer layer on electrical tunneling, and reduces non-radiative recombination at the interface between the perovskite light-absorbing layer and the hole transport layer, while not affecting carrier transport.
2. Inorganic nanocrystals tend to agglomerate during long-term use due to charge imbalance caused by surface defects. Once agglomerated, material stability is affected. The bonding and dispersing effects of the coupling agent prevent this phenomenon, thereby enhancing the stability of materials and devices.
3. The inorganic interface has a large number of disordered dangling bonds. The use of the coupling agent can passivate the dangling bonds on the inorganic interface, thereby inhibiting the photocatalytic reaction between the inorganic material and the interface of the perovskite, further improving stability.

Please refer to FIG. 1 again. Some embodiments of the present disclosure also provide a method for preparing the aforementioned first perovskite solar module, including the following steps:

Step 1: clean and perform ultraviolet (UV)-ozone treatment on the transparent conductive layer 6.

Step 2: prepare the blocking graded layer 1 on the transparent conductive layer 6 by vapor-phase deposition or liquid-phase deposition. The vapor-phase deposition includes using one of an atomic layer deposition (ALD) device, a chemical vapor deposition (CVD) device, a magnetron sputtering device, an electron beam evaporation device, or a thermal evaporation device to prepare the blocking graded layer 1. The liquid-phase deposition includes one of a mixed solution method, a hydrothermal method, a chemical bath deposition method, or an in-situ doping method.

Step 3: prepare the graded layer 2 on the blocking graded layer 1 by the vapor-phase deposition or the liquid-phase deposition. The vapor-phase deposition includes using one of the ALD device, the CVD device, the magnetron sputtering device, the electron beam evaporation device, or the thermal evaporation device to prepare the graded layer 2. The liquid-phase deposition includes one of the mixed solution method, the hydrothermal method, the chemical bath deposition method, or the in-situ doping method.

Step 4: prepare the hole transport layer 3 on a surface of the graded layer 2 using one of the ALD device, the CVD device, the magnetron sputtering device, the electron beam evaporation device, or the thermal evaporation device, or prepare the hole transport layer 3 by a process of a solution blade coating, a slot-die coating, or a spray coating.

Step 5: prepare the buffer layer 4 on a surface of the hole transport layer 3 by the vapor-phase deposition or the liquid-phase deposition. The vapor-phase deposition includes using one of the ALD device, the CVD device, the magnetron sputtering device, the electron beam evaporation device, or the thermal evaporation device to prepare the buffer layer 4. The liquid-phase deposition includes one of the mixed solution method, the hydrothermal method, the chemical bath deposition method, or the in-situ doping method.

Step 6: sequentially prepare the perovskite light-absorbing layer 7, the electron transport layer 8, and the back electrode 9 on a surface of the buffer layer 4 until a fabrication of the first perovskite solar module is completed.

Please refer to FIG. 2 again. Some embodiments of the present disclosure further provide a method for preparing the aforementioned second perovskite solar module, which includes the following steps.

Step I: clean and perform UV-ozone treatment on the transparent conductive layer 6.

Step II: prepare the blocking graded layer 1 on the transparent conductive layer 6 using a vapor-phase deposition or a liquid-phase deposition. The vapor-phase deposition includes using an ALD device, a CVD device, a magnetron sputtering device, an electron beam evaporation device, or a thermal evaporation device to prepare the blocking graded layer 1. The liquid-phase deposition includes one of a mixed solution method, a hydrothermal method, a chemical bath deposition method, or an in-situ doping method.

Step III: mix the coupling agent with a material solution for preparing the graded layer 2 to obtain a first composite precursor solution, perform UV light treatment or high-temperature treatment on the first composite precursor solution to obtain a treated first composite precursor solution, coat the treated first composite precursor solution onto a surface of the blocking graded layer 1, and anneal and dry to obtain the array graded layer 2.

Step IV: prepare the hole transport layer 3 on a surface of the array graded layer 2 using one of the ALD device, the CVD device, the magnetron sputtering device, the electron beam evaporation device, or the thermal evaporation device, or prepare the hole transport layer 3 by a process of a solution blade coating, a slot-die coating, or a spray coating.

Step V: prepare the buffer layer 4 on a surface of the hole transport layer 3 using the vapor-phase deposition or the liquid-phase deposition. The vapor-phase deposition includes using one of the ALD device, the CVD device, the magnetron sputtering device, the electron beam evaporation device, or the thermal evaporation device to prepare the buffer layer 4. The liquid-phase deposition includes one of the mixed solution method, the hydrothermal method, the chemical bath deposition method, or the in-situ doping method.

Step VI: sequentially prepare the perovskite light-absorbing layer 7, the electron transport layer 8, and the back electrode 9 on a surface of the buffer layer 4 until a fabrication of the second perovskite solar module is completed.

Please refer to FIG. 3 again. Some embodiments of the present disclosure further provide a method for preparing the aforementioned second perovskite solar module, which includes the following steps:

Step 1: clean and perform UV-ozone treatment on the transparent conductive layer 6.

Step 2: prepare the blocking graded layer 1 on the transparent conductive layer 6 using a vapor-phase deposition or a liquid-phase deposition. The vapor-phase deposition includes using an ALD device, a CVD device, a magnetron sputtering device, an electron beam evaporation device, or a thermal evaporation device to prepare the blocking graded layer. The liquid-phase deposition includes one of a mixed solution method, a hydrothermal method, a chemical bath deposition method, or an in-situ doping method.

Step 3: prepare the graded layer 2 on the blocking graded layer 1 using the vapor-phase deposition or the liquid-phase deposition. The vapor-phase deposition includes using one of the ALD device, the CVD device, the magnetron sputtering device, the electron beam evaporation device, or the thermal evaporation device to prepare the graded layer 2. The liquid-phase deposition includes one of the mixed solution method, the hydrothermal method, the chemical bath deposition method, or the in-situ doping method.

Step 4: prepare the hole transport layer 3 on a surface of the graded layer 2 using one of the ALD device, the CVD device, the magnetron sputtering device, the electron beam evaporation device, or the thermal evaporation device, or prepare the hole transport layer 3 by a process of a solution blade coating, a slot-die coating, or a spray coating.

Step 5: mix the coupling agent with a material solution for preparing the buffer layer 4 to obtain a second composite precursor solution, perform UV light treatment or high-temperature treatment on the second composite precursor solution to obtain a treated second composite precursor solution, coat the treated second composite precursor solution onto a surface of the hole transport layer 3, and anneal and dry to obtain the array buffer layer 4.

Step 6: sequentially prepare the perovskite light-absorbing layer 7, the electron transport layer 8, and the back electrode 9 on a surface of the array buffer layer 4 until a fabrication of the second perovskite solar module is completed.

Please refer to FIG. 4 again. Some embodiments of the present disclosure further provide a method for preparing the aforementioned second perovskite solar module, which includes the following steps:

Step A: clean and perform UV-ozone treatment on the transparent conductive layer 6.

Step B: mix the coupling agent with a material solution for preparing the blocking graded layer 1 to obtain a third composite precursor solution, perform UV light treatment or high-temperature treatment on the third composite precursor solution to to obtain a treated third composite precursor solution, coat the treated third composite precursor solution onto a surface of the transparent conductive layer, and anneal and dry to obtain the array blocking graded layer 1.

Step C: prepare the graded layer 2 on the array blocking graded layer 1 using a vapor-phase deposition or a liquid-phase deposition. The vapor-phase deposition includes using an ALD device, a CVD device, a magnetron sputtering device, an electron beam evaporation device, or a thermal evaporation device to prepare the graded layer 2. The liquid-phase deposition includes one of a mixed solution method, a hydrothermal method, a chemical bath deposition method, or an in-situ doping method.

Step D: prepare the hole transport layer 3 on a surface of the graded layer 2 using one of the ALD device, the CVD device, the magnetron sputtering device, the electron beam evaporation device, or the thermal evaporation device, or prepare the hole transport layer 3 by a process of a solution blade coating, a slot-die coating, or a spray coating.

Step E: prepare the buffer layer 4 on a surface of the hole transport layer 3 using the vapor-phase deposition or the liquid-phase deposition. The vapor-phase deposition includes using one of the ALD device, the CVD device, the magnetron sputtering device, the electron beam evaporation device, or the thermal evaporation device to prepare the buffer layer 4. The liquid-phase deposition includes one of the mixed solution method, the hydrothermal method, the chemical bath deposition method, or the in-situ doping method.

Step F: sequentially prepare the perovskite light-absorbing layer 7, the electron transport layer 8, and the back electrode 9 on a surface of the buffer layer 4 until a fabrication of the second perovskite solar module is completed.

In some embodiments, a condition of the UV light treatment includes: a light wavelength range of 265 nm~365 nm and a treatment duration of 5 min~60 min. A condition of the high-temperature treatment includes: a heating temperature range of 50~100° C., and a heating duration of 5 min~60 min.

The following further illustrates a structure of a perovskite solar module and a preparation method thereof provided by some embodiments of the present disclosure through specific embodiments.

Embodiment 1

Please refer to FIG. 1 again. An embodiment of the method for preparing the first perovskite solar module provided by some embodiments of the present disclosure includes the following steps.

Step 11: clean a glass with pre-prepared fluorine-doped tin oxide (FTO) transparent conductive layer 6 sequentially with detergent, deionized water, acetone, and isopropanol via ultrasonic cleaning for 30 min each, then dry with $N_2$ blowing and treat with UV O-zone for 10 min.

Step 12: prepare an Al-doped tin oxide layer via a CVD method, with an Al doping ratio of 5~10%, to obtain a blocking graded layer 1.

Step 13: prepare a graded layer 2 with a thickness of 0.2 nm~30 nm on a surface of the blocking graded layer 1 using the magnetron sputtering device. A material of the graded layer 2 has a structural formula $Ni_{0.15}Al_{0.05}Sn_{0.8}O_{1.825}$.

Step 14: spin-coat a 0.15 M nickel acetylacetonate ethanol solution on a surface of the graded layer 2 at 4000R for 30 s, then burn at 400° C. for 30 min to prepare a nickel oxide hole transport layer 3.

Step 15: prepare a buffer layer 4 using a solution combustion method. A material of the buffer layer 4 has a structural formula $NiN_{0.3}O_{0.7}$. Dissolve 29 mg of $NiNO_3 \cdot 6H_2O$ and 3 mg of urea in 1 mL of deionized water and stir, and then prepare a film of a buffer layer 4 with a thickness of 0.2 nm~50 nm on a surface of the nickel oxide hole transport layer 3 using the spray coating method. Heat at 400° C. for 30 min in $N_2$ atmosphere, followed by heating at 200° C. in the air for 10 min.

Step 16: prepare the perovskite light-absorbing layer 7 on a surface of the buffer layer 4 using a one-step solution method.

Step 17: sequentially coat the electron transport layer 8 (PCBM) and the blocking layer (BCP) on a surface of the perovskite light-absorbing layer 7.

Step 18: prepare the back electrode 9 (Ag) on a surface of the blocking layer until a fabrication of the perovskite solar module is completed.

Embodiment 2

Please refer to FIG. 1 again. An embodiment of the method for preparing the second perovskite solar module provided by some embodiments of the present disclosure includes the following steps:

Step 21: clean a glass with a prepared FTO transparent conductive layer 6 sequentially with detergent, deionized water, acetone, and isopropanol via ultrasonic cleaning for 30 min each, then dry with $N_2$ blowing and treat with UV O-zone for 10 min.

Step 22: prepare an Nb-doped tin oxide using the magnetron sputtering method, with an Nb doping ratio of 3~8%, to obtain a blocking graded layer 1.

Step 23: prepare a graded layer 2 with a thickness of 0.2 nm~30 nm on a surface of the blocking graded layer 1 using the mixed solution method. A material of the graded layer 2 has a structural formula $Cu_{0.05}Al_{0.2}Sn_{0.75}O_{1.85}$. Dissolve 1.4 mg of $CuCl_2$, 5.4 mg of $AlCl_3$, and 28.5 mg of $SnCl_2$ in 1 mL of deionized water, stir, and set aside. Prepare the graded layer 2 film with a thickness of 0.2 nm~30 nm on a surface of the blocking graded layer 1 using the blade coating method, then heat in the air at 500° C. for 1 h to obtain a desired graded layer 2.

Step 24: prepare the $Cu_2O$ hole transport layer 3 on a surface of the graded layer 2 using the magnetron sputtering device.

Step 25: prepare the buffer layer 4 on a surface of the $Cu_2O$ hole transport layer 3 using the magnetron sputtering device. A material of the buffer layer 4 has a structural formula $Cu_{0.4}Al_{0.6}O_{1.1}$.

Step 26: prepare the perovskite light-absorbing layer 7 on a surface of the buffer layer 4 using a one-step solution method.

Step 27: sequentially coat the electron transport layer 8 (C60) and the blocking layer (zirconium acetylacetonate) on a surface of the perovskite light-absorbing layer 7.

Step 28: prepare the back electrode 9 (Ag) on a surface of the blocking layer until a fabrication of the perovskite solar module is completed.

The multilayer composite transport layer of the first perovskite solar module provided by some embodiments of the present disclosure has the following characteristics.

1. Commonly used transparent conductive layers, such as FTO, are n-type doped. Some embodiments of the present disclosure introduce p-type dopants like Al, B, and Si in the graded layer, forming a doping concentration gradient and energy level graded between the transparent conductive layer and the hole transport layer. Additionally, the buffer layer replaces organic compounds with nitrogen-containing inorganic compounds, which exhibit good photothermal stability, passivate surface defects of the hole transport layer, and enhance the stability of the second interface between the hole transport layer and the perovskite light-absorbing layer.
2. The perovskite solar module provided by some embodiments of the present disclosure adopts a multilayer composite transport layer, significantly enhancing the light stability of the perovskite solar module. For instance, when $NiO_x$ serves as the hole transport layer, Ni primarily exists in the forms of $Ni^{2+}$, $Ni^{3+}$, and a small amount of $Ni^{4+}$ $Ni^{3+}$ can improve carrier transport, but the presence of $Ni^{3+}$ and high-valent Ni also induces photocatalysis of Ni, affecting the light stability of the perovskite solar module. The graded layer provided by some embodiments of the present disclosure facilitates the graded from hole transport materials to perovskite materials while controlling the proportion of $Ni^{3+}$ and high-valent Ni in the graded layer, greatly improving the light stability of the perovskite solar module.
3. Common transparent conductive layers (e.g., FTO) have a high concentration of fluorine doping. During long-term use of a perovskite solar module, fluoride ions may migrate to an active layer of the perovskite solar module. The blocking graded layer provided by some embodiments of the present disclosure can effectively inhibit this migration, enhancing the light stability of the perovskite solar module.

Figure 6:
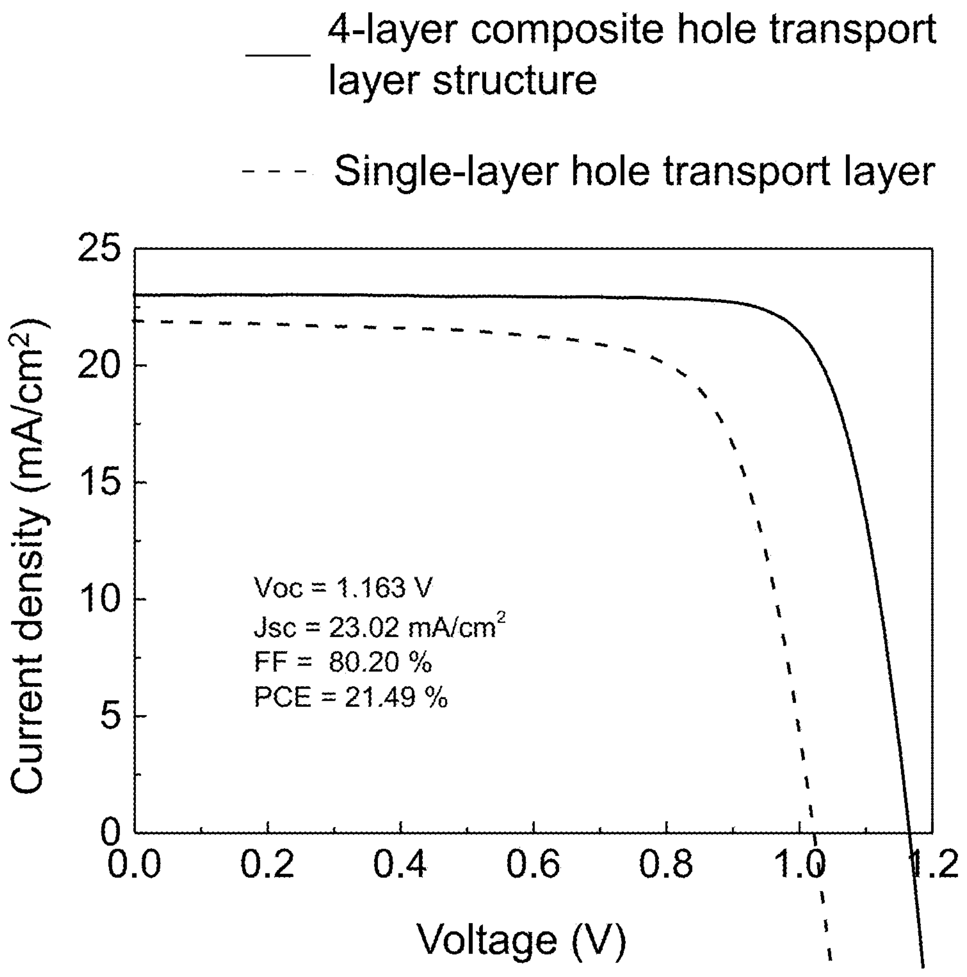
FIG. 6 is a schematic comparison diagram of conversion efficiency curves of a perovskite solar module prepared in Embodiment 1 and a perovskite solar module of Comparative Example 1 according to some embodiments of the present disclosure.

FIG. 6 is a schematic comparison diagram of conversion efficiency curves of a perovskite solar module prepared in Embodiment 1 and a perovskite solar module of Comparative Example 1 according to some embodiments of the present disclosure. As shown in FIG. 6, a conversion efficiency curve of the perovskite solar module prepared in Embodiment 1 (i.e., a 4-layer composite hole transport layer structure) is compared with a conversion efficiency curve of an existing perovskite solar module with a single-layer hole transport layer of Comparative Example 1. From FIG. 6, it can be observed that an open-circuit voltage of the 4-layer composite hole transport layer structure described in the present disclosure is significantly improved, reaching 1.16 V, whereas an open-circuit voltage of the single-layer hole transport layer is 1.014 V.

Figure 7:
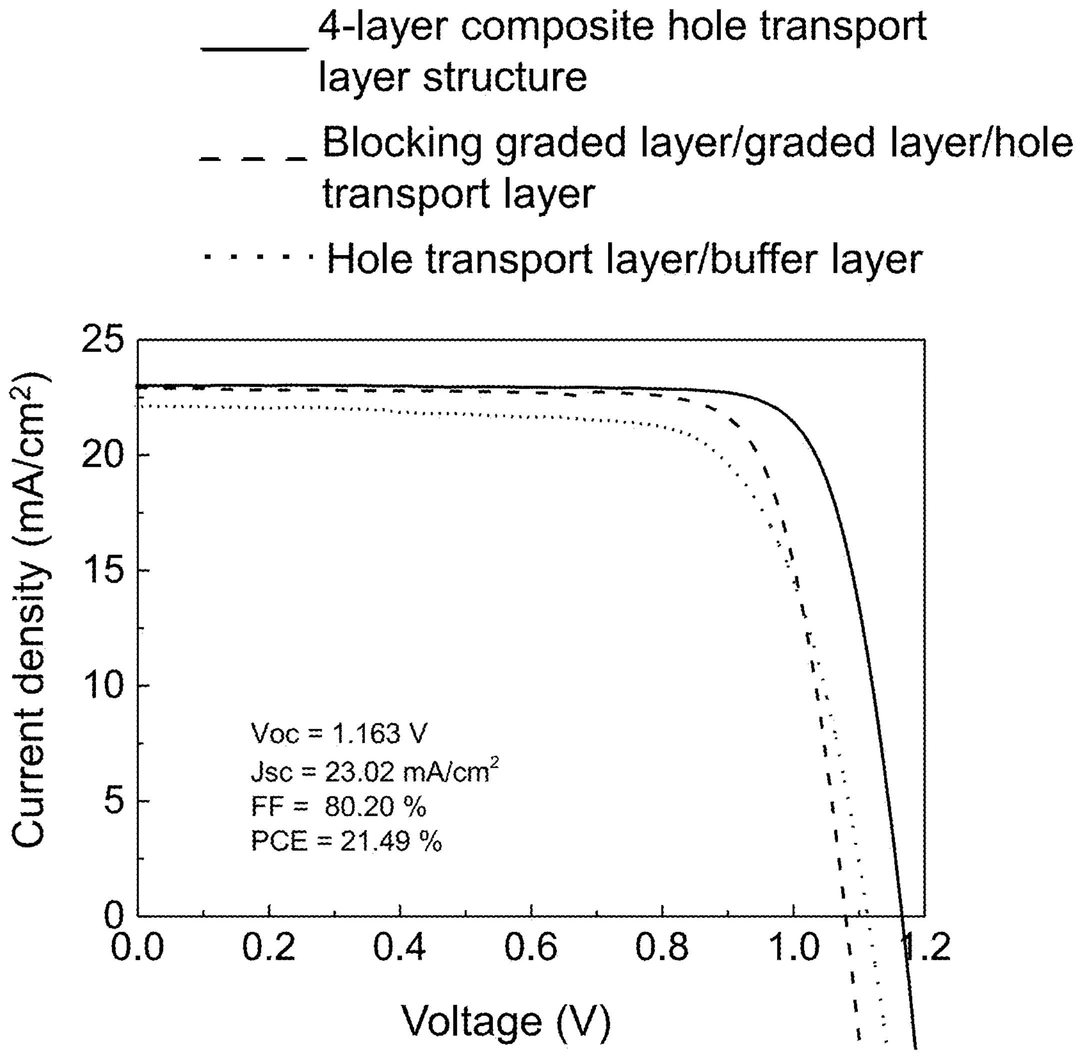
FIG. 7 is a schematic comparison diagram of conversion efficiency curves of the perovskite solar module prepared in Embodiment 1 and perovskite solar modules of Comparative Examples 2-3 according to some embodiments of the present disclosure.

FIG. 7 is a schematic comparison diagram of conversion efficiency curves of the perovskite solar module prepared in Embodiment 1 and perovskite solar modules of Comparative Examples 2-3 according to some embodiments of the present disclosure. As shown in FIG. 7, a conversion efficiency curve of the perovskite solar module prepared in Embodiment 1 (i.e., a 4-layer composite hole transport layer structure) is compared with a conversion efficiency curve of a perovskite solar module with a composite hole transport layer structure including a blocking graded layer, a graded layer, and a hole transport layer of Comparative Example 2 (i.e., blocking graded layer/graded layer/hole transport layer). An open-circuit voltage of Comparative Example 2 reaches 1.07 V, and the short-circuit current and fill factor are significantly improved compared to Comparative Example 1 (i.e., single-layer hole transport layer). The difference between Comparative Example 2 and Embodiment 1 is the absence of a buffer layer in Comparative Example 2. Comparative Example 3 shows a conversion efficiency curve of a perovskite solar module with a composite hole transport layer structure including a hole transport layer and a buffer layer (i.e., hole transport layer/buffer layer). From FIG. 7, it can be observed that the open-circuit voltage of Comparative Example 3 is notably improved, reaching 1.11 V, but the short-circuit current and fill factor are suboptimal. The 4-layer composite hole transport structure of Embodiment 1 in the present disclosure demonstrates significant improvements in the open-circuit voltage, the short-circuit current, and the fill factor compared to the above structures, with Voc reaching 1.16 V, Jsc increasing to 23 $mA/cm^2$, FF exceeding 80%, and efficiency achieving 21.49%.

Figure 8:
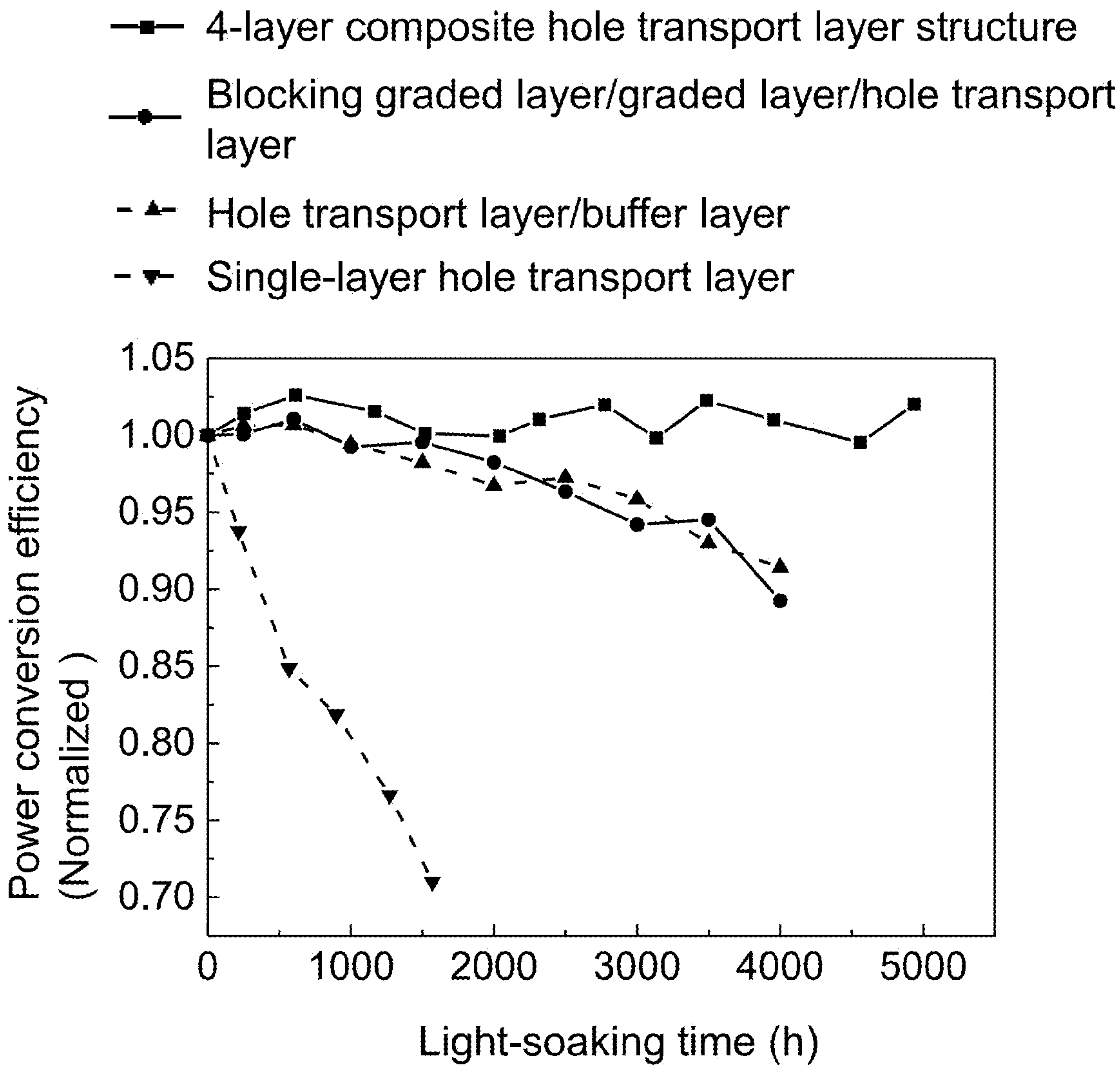
FIG. 8 is a schematic comparison diagram of light-soaking aging of the perovskite solar module prepared in Embodiment 1 and the perovskite solar modules of Comparative Examples 1-3 according to some embodiments of the present disclosure.

FIG. 8 is a schematic comparison diagram of light-soaking aging of the perovskite solar module prepared in Embodiment 1 and the perovskite solar modules of Comparative Examples 1-3 according to some embodiments of the present disclosure. As shown in FIG. 8, a light-soaking aging test curve of the perovskite solar module prepared in Embodiment 1 (i.e., a 4-layer composite hole transport structure) is compared with light-soaking aging test curves of Comparative Example 1, which is an existing perovskite solar module with a single-layer hole transport layer, Comparative Example 2, a perovskite solar module with a composite hole transport layer structure including a blocking graded layer, a graded layer, and a hole transport layer (i.e., blocking graded layer/graded layer/hole transport layer), and Comparative Example 3, a perovskite solar module with a composite hole transport layer structure including a hole transport layer and a buffer layer (i.e., hole transport layer/buffer layer). From FIG. 8, it can be observed that the light stability of Comparative Examples 2 and 3 is significantly improved, while the light stability of Embodiment 1 in the present disclosure is substantially enhanced compared to Comparative Examples 1-3, showing no degradation after nearly 5000 hours of light-soaking aging.

Embodiment 3

Please refer to FIG. 2 again. An embodiment of the method for preparing the second perovskite solar module provided by some embodiments of the present disclosure includes the following steps:

Step 31: clean a glass with the prepared FTO transparent conductive layer 6 sequentially with detergent, deionized water, acetone, and isopropanol via ultrasonic cleaning for 30 min each, then dry with $N_2$ blowing and treat with UV Ozone for 10 min.

Step 32: prepare an Al-doped tin oxide layer via a CVD method, with an Al doping ratio of 5~10%, to obtain a blocking graded layer 1 with a thickness of 1 nm~30 nm.

Step 33: mix 3-aminopropyltriethoxysilane with $Al_2O_3$ and $SnO_2$ nanoparticle suspension (10 wt. %, 100 nm) in IPA at a volume ratio of 1%, stir the mixture, and irradiate under a 365 nm UV lamp for 10 min for later use. Apply the mixed suspension onto the blocking graded layer 1 using a blade coating method, and after wet film heating and annealing, form an array graded layer 2 with a thickness of 0.2 nm~30 nm.

Step 34: spin-coat a 0.15M nickel acetylacetonate ethanol solution onto a surface of the array graded layer 2 at 4000R for 30 s, then burn at 400° C. for 30 min to prepare a nickel oxide hole transport layer 3 with a thickness of 1 nm~100 nm.

Step 35: prepare a buffer layer 4 using a solution combustion method. A material of the buffer layer 4 has a structural formula $NiN_{0.3}O_{0.7}$. Dissolve 29 mg of $NiNO_3{\cdot}6H_2O$ and 3 mg of urea in 1 mL of deionized water, stir, and then spray-coat onto a surface of the nickel oxide hole transport layer 3 to form a buffer layer 4 film with a thickness of 0.2 nm~50 nm. Heat at 400° C. for 30 min in a $N_2$ atmosphere, followed by heating at 200° C. in the air for 10 min.

Step 36: prepare the perovskite light-absorbing layer 7 on a surface of the buffer layer 4 using a one-step solution method.

Step 37: sequentially coat the electron transport layer 8 (PCBM) and the blocking layer (BCP) on a surface of the perovskite light-absorbing layer 7.

Step 38: prepare the back electrode 9 (Ag) on a surface of the blocking layer until the perovskite solar module is completed.

Embodiment 4

Figure 5:
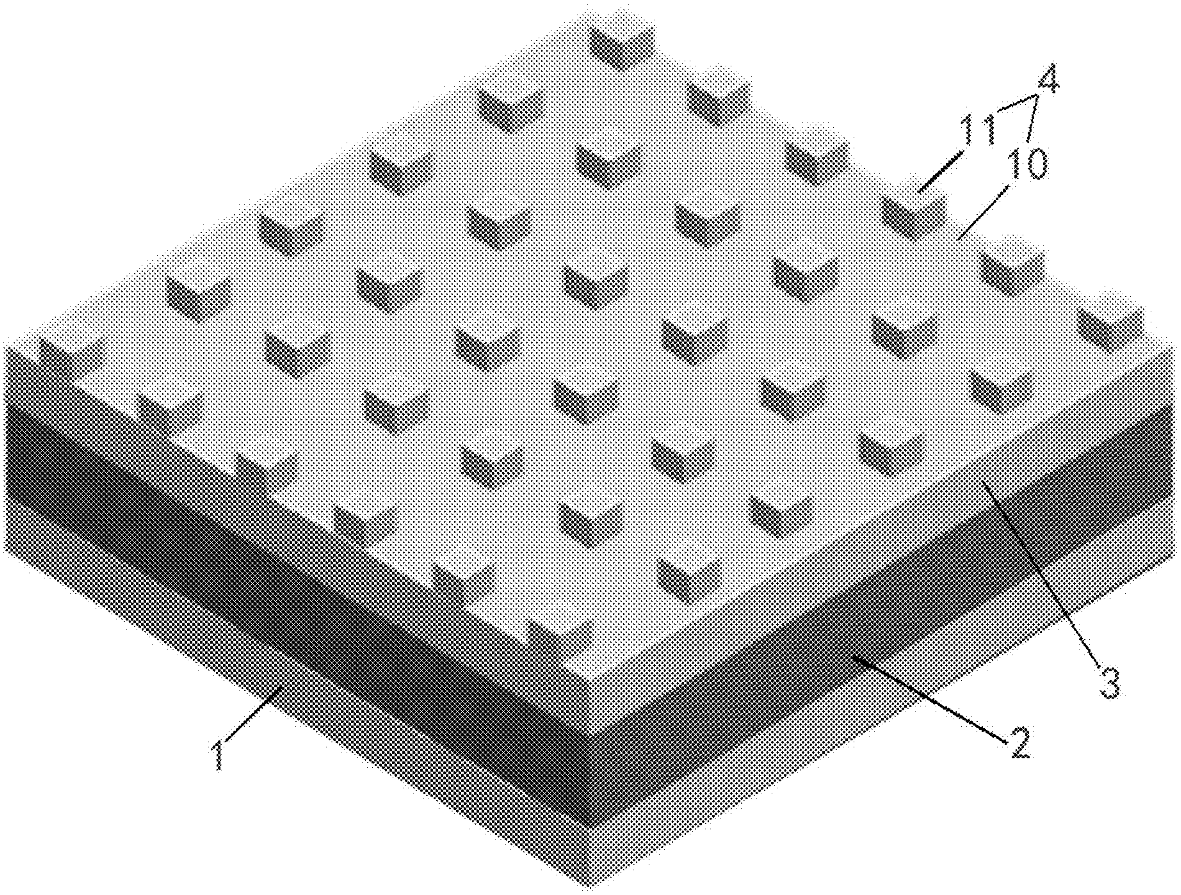
FIG. 5 is a schematic three-dimensional diagram of a multilayer composite transport layer in the second internal structure of the second perovskite solar module in FIG. 3.

FIG. 5 is a schematic three-dimensional diagram of a multilayer composite transport layer in the second internal structure of the second perovskite solar module in FIG. 3.

Please refer to FIGS. 3 and 5. Another embodiment of the method for preparing the second perovskite solar module provided by some embodiments of the present disclosure includes the following steps:

Step 41: clean a glass with a pre-prepared FTO transparent conductive layer 6 sequentially with detergent, deionized water, acetone, and isopropanol via ultrasonic cleaning for 30 min each, then dry with $N_2$ blowing and treat with UV O-zone for 10 min.

Step 42: prepare Nb-doped tin oxide using a magnetron sputtering method, with an Nb doping ratio of 3~8%, to obtain a blocking graded layer 1.

Step 43: prepare a graded layer 2 with a thickness of 1 nm~100 nm on a surface of the blocking graded layer 1 using a mixed solution method. A material of the graded layer 2 has a structural formula $Cu_{0.05}Al_{0.2}Sn_{0.75}O_{1.85}$. Dissolve 1.4 mg of $CuCl_2$, 5.4 mg of $AlCl_3$, and 28.5 mg of $SnCl_2$ in 1 mL of deionized water, stir, and set aside. Prepare a graded layer 2 film with a thickness of 1 nm~80 nm on a surface of the blocking graded layer 1 using a blade coating method, then heat at 500° C. in the air for 1 h to obtain a desired graded layer 2.

Step 44: prepare the $Cu_2O$ hole transport layer 3 on a surface of the graded layer 2 using the magnetron sputtering device.

Step 45: mix vinyltriethoxysilane with $Cu_2O$ and $SiO_2$ nanoparticle suspension (10 wt. %, 80 nm) in deionized water at a volume ratio of 3%, stir, and heat the mixed solution at 80~100° C. with stirring for 30 min for later use. Apply the stirred suspension onto the $Cu_2O$ hole transport layer 3 using the blade coating method, and after annealing, obtain an array buffer layer 4 including openings 10.

Step 46: prepare the perovskite light-absorbing layer 7 on a surface of the array buffer layer 4 using a one-step solution method.

Step 47: sequentially coat the electron transport layer 8 (C60) and the blocking layer (zirconium acetylacetonate) on a surface of the perovskite light-absorbing layer 7.

Step 48: prepare the back electrode 9 (Ag) on a surface of the blocking layer until a fabrication of the perovskite solar module is completed.

The multilayer composite transport layer of the second perovskite solar module provided by some embodiments of the present disclosure has the following characteristics:

1. Commonly used transparent conductive layers, such as FTO, are n-type doped. Some embodiments of the present disclosure introduce p-type dopants like Al, B, and Si in the graded layer, forming a doping concentration gradient and energy level graded between the transparent conductive layer and the hole transport layer. Additionally, the buffer layer replaces organic compounds with nitrogen-containing inorganic compounds, which exhibit good photothermal stability, passivate surface defects of the hole transport layer, and enhance the stability of the second interface between the hole transport layer and the perovskite light-absorbing layer.
2. The perovskite solar module provided by some embodiments of the present disclosure significantly improves light stability due to the adoption of a multilayer composite transport layer. For example, when $NiO_x$ is used as the hole transport layer, Ni mainly exists in the forms of $Ni^{2+}$, $Ni^{3+}$, and a small amount of $Ni^{4+}$. $Ni^{3+}$ can enhance carrier transport, but the presence of $Ni^{3+}$ and high-valent Ni also induces photocatalysis of Ni, affecting the light stability of the perovskite solar module. The graded layer provided by some embodiments of the present disclosure facilitates the graded from hole transport materials to perovskite materials while controlling the proportion of $Ni^{3+}$ and high-valent Ni in the graded layer, greatly improving the light stability of the perovskite solar module.
3. Commonly used transparent conductive layers like FTO have a high concentration of fluorine doping. During long-term use of a perovskite solar module, fluorine may migrate to an active layer of the perovskite solar module. The blocking graded layer provided by some embodiments of the present disclosure can effectively inhibit such migration, enhancing the light stability of the perovskite solar module.
4. During coating, nanoparticles simply form openings, addressing the issue of overly dense inorganic oxide layer structures. This eliminates the impact of the thicknesses of the graded layer and the buffer layer on electrical tunneling, and reduces non-radiative recombination at the interface between the perovskite light-absorbing layer and the hole transport layer, while not affecting carrier transport.
5. Inorganic nanocrystals tend to agglomerate during long-term use due to charge imbalance caused by surface defects. Once agglomerated, material stability is affected. The bonding and dispersing effects of the coupling agent prevent this phenomenon, thereby enhancing the stability of materials and devices.
6. The inorganic interface has numerous disordered dangling bonds. The use of the coupling agent can also passivate these dangling bonds on inorganic interface, thereby inhibiting the photocatalytic reaction between the inorganic material and the interface of the perovskite, further improving stability.

Figure 9:
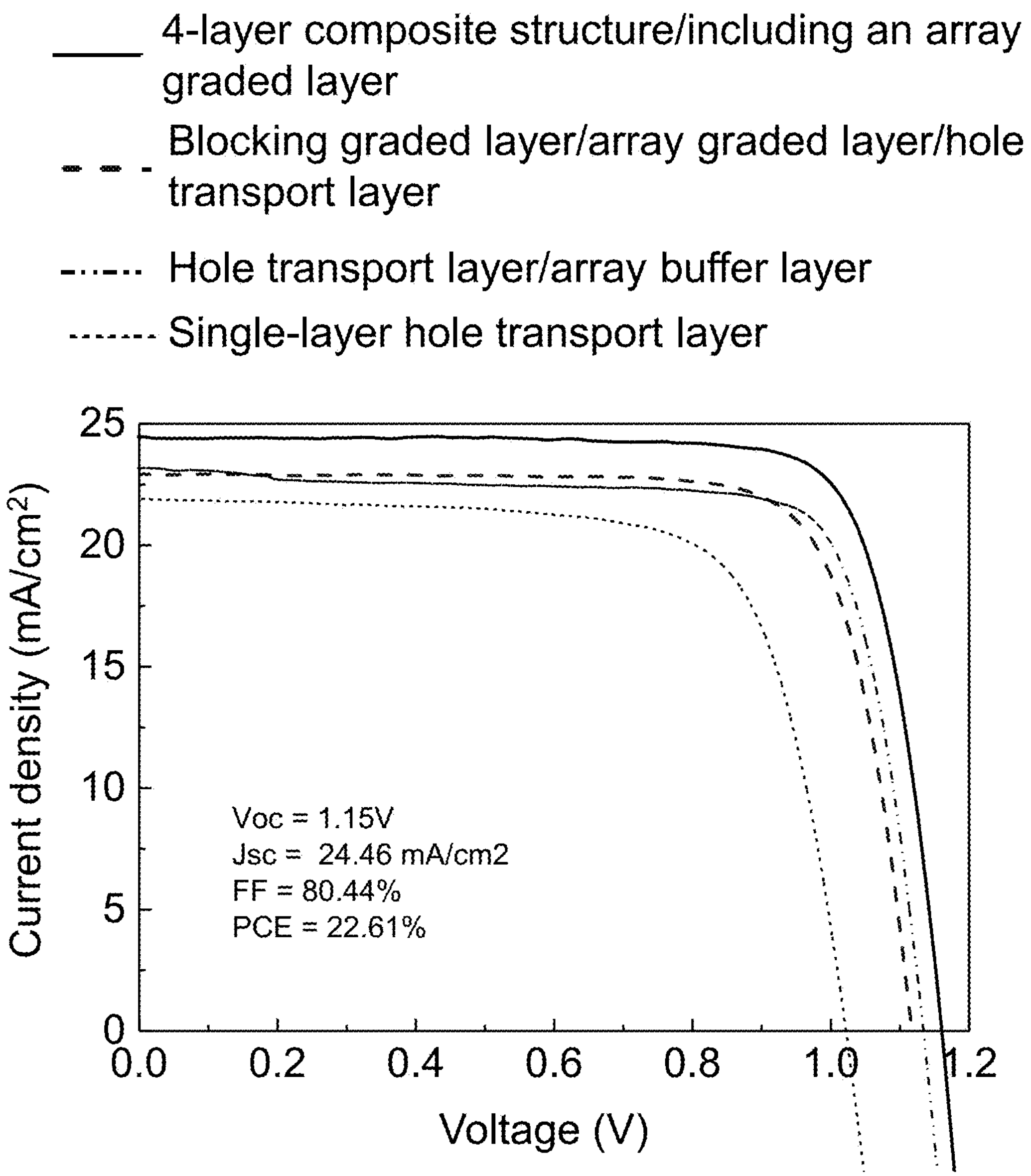
FIG. 9 is a schematic comparison diagram of conversion efficiency curves of a perovskite solar module prepared in Embodiment 3 and perovskite solar modules of Comparative Example 1, Comparative Example 4, and Comparative Example 5 according to some embodiments of the present disclosure.

FIG. 9 is a schematic comparison diagram of conversion efficiency curves of a perovskite solar module prepared in Embodiment 3 and perovskite solar modules of Comparative Example 1, Comparative Example 4, and Comparative Example 5 according to some embodiments of the present disclosure. As shown in FIG. 9, a conversion efficiency curve of the perovskite solar module prepared in Embodiment 3 (i.e., the hole transport layer is a 4-layer composite structure/including an array graded layer) is compared with conversion efficiency curves of Comparative Example 1, which is an existing perovskite solar module with a single-layer hole transport layer (i.e., a single-layer hole transport layer), Comparative Example 4, a perovskite solar module including a blocking graded layer, an array graded layer, and a hole transport layer (i.e., blocking graded layer/array graded layer/hole transport layer), and Comparative Example 5, a perovskite solar module including a hole transport layer and an array buffer layer (i.e., hole transport layer/array buffer layer). The difference between Comparative Example 4 and Embodiment 3 is the absence of a buffer layer in Comparative Example 4. The difference between Comparative Example 5 and Embodiment 4 is the absence of both the blocking graded layer and the array graded layer in Comparative Example 5. From FIG. 9, it can be observed that the perovskite solar modules of Comparative Examples 4 and 5 show significant efficiency improvements over the perovskite solar module of Comparative Example 1. The perovskite solar module of Embodiment 3, with an open-circuit voltage reaching 1.15V and a fill factor (FF) reaching 80.44%, exhibits substantially higher open-circuit voltage (1.15V) and short-circuit current compared to the perovskite solar modules of Comparative Example 1, Comparative Example 4, and Comparative Example 5. Additionally, comparing FIGS. 7 and 9 reveals that the perovskite solar module including a 4-layer composite structure with an array layer achieves better device efficiency than the perovskite solar module including a 4-layer composite structure without an array layer, with a short-circuit current increasing from 23.02 $mA/cm^2$ to 24.46 $mA/cm^2$ and a conversion efficiency improving from 21.49% to 22.61% (about 5.2% enhancement).

Figure 10:
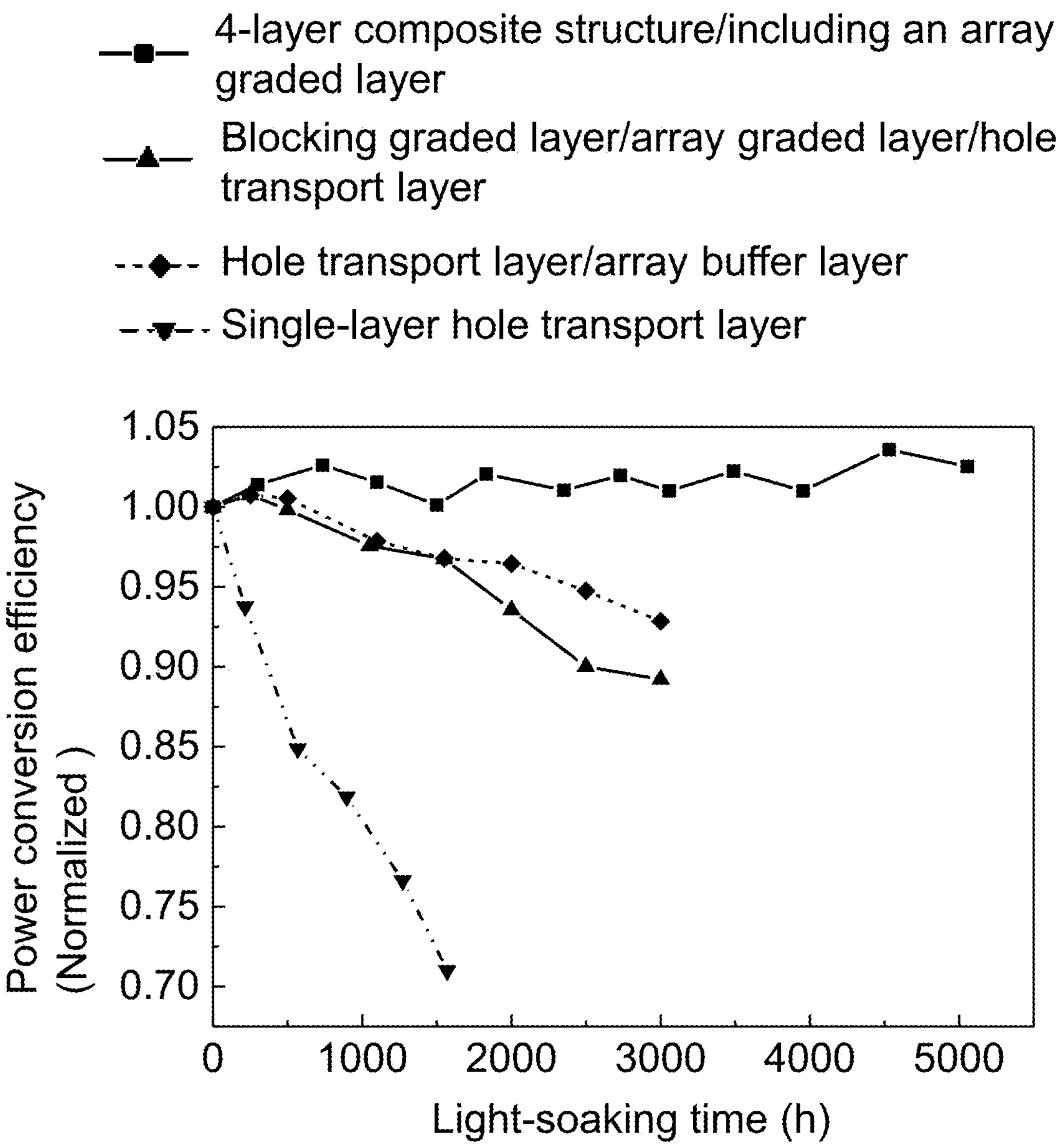
FIG. 10 is a schematic comparison diagram of aging curves of the perovskite solar module prepared in Embodiment 3 and the perovskite solar modules of Comparative Example 1, Comparative Example 4, and Comparative Example 5 according to some embodiments of the present disclosure.

FIG. 10 is a schematic comparison diagram of aging curves of the perovskite solar module prepared in Embodiment 3 and the perovskite solar modules of Comparative Example 1, Comparative Example 4, and Comparative Example 5 according to some embodiments of the present disclosure. As shown in FIG. 10, a light-soaking aging test curve of the perovskite solar module prepared in Embodiment 3 (i.e., the hole transport layer is a 4-layer composite structure/including an array graded layer), is compared with light-soaking aging test curves of Comparative Example 1, which is an existing perovskite solar module with a single-layer hole transport layer (i.e., a single-layer hole transport layer), Comparative Example 4, a perovskite solar module including a blocking graded layer, an array graded layer, and a hole transport layer (i.e., blocking graded layer/array graded layer/hole transport layer), and Comparative Example 5, a perovskite solar module including a hole transport layer and an array buffer layer (i.e., hole transport layer/array buffer layer). The difference between Comparative Example 4 and Embodiment 3 is the absence of a buffer layer in Comparative Example 4. The difference between Comparative Example 5 and Embodiment 4 is the absence of both the blocking graded layer and the array graded layer in Comparative Example 5. From FIG. 10, it can be observed that the perovskite solar module of Embodiment 3 exhibits dramatically improved light stability over the perovskite solar modules of Comparative Examples 1, 4, and 5, showing no degradation after 5000 hours of light-soaking aging. Additionally, comparing FIGS. 8 and 10 reveals that the perovskite solar module including a 4-layer composite structure with an array layer achieves slightly better light stability than the perovskite solar module including a 4-layer composite structure without an array layer, and two types of perovskite solar module maintain undiminished conversion efficiency after 5000 hours of light-soaking aging.

The multilayer composite transport layer, the perovskite solar module, and preparation method thereof achieve precise regulation of the energy band structure at device interfaces and effective suppression of interface defects by introducing the multilayer composite hole transport structure into the perovskite solar module. The beneficial effects include and are not limited to:

(1) Improved environmental stability of the device: The blocking graded layer effectively blocks the intrusion of oxygen and moisture from the environment, reducing performance degradation caused by external environment and significantly enhancing the long-term stability of the module. The introduction of doped elements further optimizes charge injection and transport properties, extending the operational lifespan of the module.

(2) Optimized energy band matching and reduced interface defects: The functional layers in the multilayer composite structure (the blocking graded layer, the graded layer, the hole transport layer, and the buffer layer) synergistically regulate material composition and energy band alignment, achieving effective energy level matching between layers. This greatly reduces charge traps and defects at interfaces, minimizes recombination losses, and improves photoelectric conversion efficiency.

(3) Enhanced charge transport efficiency and charge balance: The graded layer promotes efficient charge injection and transport between layers, alleviating the hole conduction challenges caused by high defect density or excessive densification in traditional single hole transport layer. Meanwhile, the buffer layer balances hole and electron charges, further improving device performance.

(4) Reduced risk of perovskite active layer degradation: The multilayer structure, particularly the blocking graded layer, effectively inhibits the migration of harmful elements (e.g., fluorine) from the transparent conductive layer, minimizing damage to the perovskite layer and thereby enhancing the long-term stability and service life of the device.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by the present disclosure and are within the spirit and scope of the exemplary embodiments of the present disclosure.

What is claimed is:

1. A multilayer composite transport layer, comprising:

a blocking graded layer, a graded layer, a hole transport layer, and a buffer layer stacked in sequence along a light incidence direction; wherein a preparation material of the blocking graded layer is a fluorine-doped tin oxide material doped with element R to replace element F, wherein a replacement ratio of the element R to the element F ranges from 1% to 100%, and the element R is at least one element of W, Nb, Ni, Al, or Si;

a preparation material of the graded layer is $Ni_xA_ySi_zSn_mO_n$ or $Cu_xA_ySi_zSn_mO_n$, where x>0, y>=0, z>=0, m>=0, n>0, A is aluminum or boron, and the preparation material of the graded layer includes at least one element of A, Si, or Sn;

a preparation material of the hole transport layer is one of $NiO_x$, $Cu_xO$, or CuSCN; and a preparation material of the buffer layer is $Ni_aE_bN_cO_d$ or $Cu_aE_bN_cO_d$, where a>0, b>=0, c>0, d>=0, and E is one element of Al, B, Si, Zn, Co, or Zr.

2. A multilayer composite transport layer, comprising:

a blocking graded layer, a graded layer, a hole transport layer, and a buffer layer stacked in sequence along a light incidence direction; wherein a preparation material of the blocking graded layer is a fluorine-doped tin oxide material doped with element R to replace element F, wherein a replacement ratio of the element R to the element F ranges from 1% to 100%, and the element R is at least one element of W, Nb, Ni, Al, or Si;

a preparation material of the graded layer is $Ni_xA_ySi_zSn_mO_n$ or $Cu_xA_ySi_zSn_mO_n$, where x>0, y>=0, z>=0, m>=0, n>0, and A is aluminum or boron, and the preparation material of the graded layer includes at least one element of A, Si, or Sn;

a preparation material of the hole transport layer is one of $NiO_x$, $Cu_xO$, or CuSCN;

a preparation material of the buffer layer is $Ni_aE_bN_cO_d$ or $Cu_aE_bN_cO_d$, where a>0, b>=0, c>0, d>=0, and E is one element of Al, B, Si, Zn, Co, or Zr;

the preparation material of at least one of the blocking graded layer, the graded layer, and the buffer layer is doped with a coupling agent to obtain at least one of an array blocking graded layer, an array graded layer, or an array buffer layer including the coupling agent;

a thin film of at least one of the blocking graded layer, the graded layer, or the buffer layer doped with the coupling agent includes a plurality of array molecular clusters including the coupling agent which are discretely arranged and openings separating adjacent molecular clusters, with the openings connecting an upper surface and a lower surface of the thin film;

the coupling agent is one of a silane coupling agent, a titanate coupling agent, an aluminate coupling agent, a phosphate coupling agent, or a borate coupling agent; and a length of each of the openings is in a range of 10 nm~200 nm.

3. The multilayer composite transport layer according to claim 2, wherein an addition amount of the coupling agent is 0.5~5% of a volume of a nanoparticle suspension used to prepare at least one of the blocking graded layer, the graded layer, or the buffer layer, and a concentration of the nanoparticle suspension is in a range of 0.1~10 wt. %.

4. The multilayer composite transport layer according to claim 2, wherein a thickness of the blocking graded layer is in a range of 1 nm~30 nm, a thickness of the graded layer is in a range of 0.2 nm~30 nm, a thickness of the hole transport layer is in a range of 1 nm~100 nm, and a thickness of the buffer layer is in a range of 0.2 nm~50 nm.

5. A perovskite solar module, comprising a transparent conductive layer, a perovskite light-absorbing layer, an electron transport layer, and a back electrode stacked in sequence, wherein the multilayer composite transport layer of claim 1 is arranged between the transparent conductive layer and the perovskite light-absorbing layer, the blocking graded layer of the multilayer composite transport layer is in laminated contact with the transparent conductive layer, and the buffer layer is in laminated contact with the perovskite light-absorbing layer.

6. A perovskite solar module, comprising a transparent conductive layer, a perovskite light-absorbing layer, an electron transport layer, and a back electrode stacked in sequence, wherein the multilayer composite transport layer of claim 2 is arranged between the transparent conductive layer and the perovskite light-absorbing layer, the blocking graded layer of the multilayer composite transport layer is in laminated contact with the transparent conductive layer, and the buffer layer is in laminated contact with the perovskite light-absorbing layer.

7. A method for preparing the perovskite solar module of claim 5, comprising:

step 1: cleaning and performing ultraviolet (UV)-ozone treatment on the transparent conductive layer;

step 2: preparing the blocking graded layer on the transparent conductive layer by vapor-phase deposition or liquid-phase deposition, wherein the vapor-phase deposition includes using one of an atomic layer deposition (ALD) device, a chemical vapor deposition (CVD) device, a magnetron sputtering device, an electron beam evaporation device, or a thermal evaporation device to prepare the blocking graded layer, and the liquid-phase deposition includes one of a mixed solution method, a hydrothermal method, a chemical bath deposition method, or an in-situ doping method;

step 3: preparing the graded layer on the blocking graded layer by the vapor-phase deposition or the liquid-phase deposition, wherein the vapor-phase deposition includes using one of the ALD device, the CVD device, the magnetron sputtering device, the electron beam evaporation device, or the thermal evaporation device to prepare the graded layer, and the liquid-phase deposition includes one of the mixed solution method, the hydrothermal method, the chemical bath deposition method, or the in-situ doping method;

step 4: preparing the hole transport layer on a surface of the graded layer using one of the ALD device, the CVD device, the magnetron sputtering device, the electron beam evaporation device, or the thermal evaporation device, or preparing the hole transport layer by a process of a solution blade coating, a slot-die coating, or a spray coating;

step 5: preparing the buffer layer on a surface of the hole transport layer by the vapor-phase deposition or the liquid-phase deposition, wherein the vapor-phase deposition includes using one of the ALD device, the CVD device, the magnetron sputtering device, the electron beam evaporation device, or the thermal evaporation device to prepare the buffer layer, and the liquid-phase deposition includes one of the mixed solution method, the hydrothermal method, the chemical bath deposition method, or the in-situ doping method; and step 6: sequentially preparing the perovskite light-absorbing layer, the electron transport layer, and the back electrode on a surface of the buffer layer until a fabrication of the perovskite solar module is completed.

8. A method for preparing the perovskite solar module of claim 6, comprising:

step I: cleaning and performing UV-ozone treatment on the transparent conductive layer;

step II: preparing the blocking graded layer on the transparent conductive layer by vapor-phase deposition or liquid-phase deposition, wherein the vapor-phase deposition includes using one of an atomic layer deposition (ALD) device, a chemical vapor deposition (CVD) device, a magnetron sputtering device, an electron beam evaporation device, or a thermal evaporation device to prepare the blocking graded layer, and the liquid-phase deposition includes one of a mixed solution method, a hydrothermal method, a chemical bath deposition method, or an in-situ doping method;

step III: mixing the coupling agent with a material solution for preparing the graded layer to obtain a first composite precursor solution, performing UV light treatment or high-temperature treatment on the first composite precursor solution to obtain a treated first composite precursor solution, coating the treated first composite precursor solution onto a surface of the blocking graded layer, and annealing and dry to obtaining the array graded layer;

step IV: preparing the hole transport layer on a surface of the array graded layer using one of the ALD device, the CVD device, the magnetron sputtering device, the electron beam evaporation device, or the thermal evaporation device, or preparing the hole transport layer by a process of a solution blade coating, a slot-die coating, or a spray coating;

step V: preparing the buffer layer on a surface of the hole transport layer by the vapor-phase deposition or the liquid-phase deposition, wherein the vapor-phase deposition includes using one of the ALD device, the CVD device, the magnetron sputtering device, the electron beam evaporation device, or the thermal evaporation device to prepare the buffer layer, and the liquid-phase deposition includes one of the mixed solution method, the hydrothermal method, the chemical bath deposition method, or the in-situ doping method; and step VI: sequentially preparing the perovskite light-absorbing layer, the electron transport layer, and the back electrode on a surface of the buffer layer until a fabrication of the perovskite solar module is completed.

9. A method for preparing the perovskite solar module of claim 6, comprising:

step 1: cleaning and performing UV-ozone treatment on the transparent conductive layer;

step 2: preparing the blocking graded layer on the transparent conductive layer by vapor-phase deposition or liquid-phase deposition, wherein the vapor-phase deposition includes using one of an atomic layer deposition (ALD) device, a chemical vapor deposition (CVD) device, a magnetron sputtering device, an electron beam evaporation device, or a thermal evaporation device to prepare the blocking graded layer, and the liquid-phase deposition includes one of a mixed solution method, a hydrothermal method, a chemical bath deposition method, or an in-situ doping method;

step 3: preparing the graded layer on the blocking graded layer by the vapor-phase deposition or the liquid-phase deposition, wherein the vapor-phase deposition includes using one of the ALD device, the CVD device, the magnetron sputtering device, the electron beam evaporation device, or the thermal evaporation device to prepare the graded layer, and the liquid-phase deposition includes one of the mixed solution method, the hydrothermal method, the chemical bath deposition method, or the in-situ doping method;

step 4: preparing the hole transport layer on a surface of the graded layer using one of the ALD device, the CVD device, the magnetron sputtering device, the electron beam evaporation device, or the thermal evaporation device, or preparing the hole transport layer by a process of a solution blade coating, a slot-die coating, or a spray coating;

step 5: mixing the coupling agent with a material solution for preparing the buffer layer to obtain a second composite precursor solution, performing UV light treatment or high-temperature treatment on the second composite precursor solution to obtain a treated second composite precursor solution, coating the treated second composite precursor solution onto a surface of the hole transport layer, and annealing and drying to obtain the array buffer layer; and step 6: sequentially preparing the perovskite light-absorbing layer, the electron transport layer, and the back electrode on a surface of the array buffer layer until a fabrication of the perovskite solar module is completed.

10. A method for preparing the perovskite solar module of claim 6, comprising:

step A: cleaning and performing UV-ozone treatment on the transparent conductive layer;

step B: mixing the coupling agent with a material solution for preparing the blocking graded layer to obtain a third composite precursor solution, performing UV light treatment or high-temperature treatment on the third composite precursor solution to obtain a treated third composite precursor solution, coating the treated third composite precursor solution onto a surface of the transparent conductive layer, and annealing and drying to obtain the array blocking graded layer;

step C: preparing the graded layer on the array blocking graded layer by vapor-phase deposition or liquid-phase deposition, wherein the vapor-phase deposition includes using one of an atomic layer deposition (ALD) device, a chemical vapor deposition (CVD) device, a magnetron sputtering device, an electron beam evaporation device, or a thermal evaporation device to prepare the graded layer, and the liquid-phase deposition includes one of a mixed solution method, a hydrothermal method, a chemical bath deposition method, or an in-situ doping method;

step D: preparing the hole transport layer on a surface of the graded layer using one of the ALD device, the CVD device, the magnetron sputtering device, the electron beam evaporation device, or the thermal evaporation device, or preparing the hole transport layer by a process of a solution blade coating, a slot-die coating, or a spray coating;

step E: preparing the buffer layer on a surface of the hole transport layer using the vapor-phase deposition or the liquid-phase deposition, wherein the vapor-phase deposition includes using one of the ALD device, the CVD device, the magnetron sputtering device, the electron beam evaporation device, or the thermal evaporation device to prepare the buffer layer, and the liquid-phase deposition includes one of the mixed solution method, the hydrothermal method, the chemical bath deposition method, or the in-situ doping method; and Step F: sequentially preparing the perovskite light-absorbing layer, the electron transport layer, and the back electrode on a surface of the buffer layer until a fabrication of the perovskite solar module is completed.

11. The multilayer composite transport layer according to claim 2, wherein a thickness of the blocking graded layer is in a range of 0.5 nm~1 nm, a thickness of the graded layer is in a range of 0.1 nm~0.2 nm, a thickness of the hole transport layer is in a range of 0.5 nm~1 nm, and a thickness of the buffer layer is in a range of 0.1 nm~0.2 nm.

12. The multilayer composite transport layer according to claim 2, wherein a thickness of the blocking graded layer is in a range of 30 nm~40 nm, a thickness of the graded layer is in a range of 30 nm~40 nm, a thickness of the hole transport layer is in a range of 100 nm~120 nm, and a thickness of the buffer layer is in a range of 50 nm~60 nm.

13. The multilayer composite transport layer according to claim 2, wherein an addition amount of the coupling agent is 0.1~0.5% of a volume of a nanoparticle suspension used to prepare at least one of the blocking graded layer, the graded layer, or the buffer layer, and a concentration of the nanoparticle suspension is in a range of 0.05~0.1 wt. %.

14. The multilayer composite transport layer according to claim 2, wherein an addition amount of the coupling agent is 5~6% of a volume of a nanoparticle suspension used to prepare at least one of the blocking graded layer, the graded layer, or the buffer layer, and a concentration of the nanoparticle suspension is in a range of 10~12 wt. %.

15. The perovskite solar module according to claim 5, wherein the transparent conductive layer is an outermost transparent conductive layer of the perovskite solar module;

the perovskite light-absorbing layer is a core component of the perovskite solar module;

the electron transport layer is located between the perovskite light-absorbing layer and the back electrode; and the back electrode serves as a rear electrode of the perovskite solar module.

* * * * *